(12) United States Patent
Shimizu et al.

(10) Patent No.: US 7,335,457 B2
(45) Date of Patent: Feb. 26, 2008

(54) POSITIVE-TONE RADIATION-SENSITIVE RESIN COMPOSITION

(75) Inventors: Daisuke Shimizu, Tokyo (JP); Tomoki Nagai, Tokyo (JP); Yuuji Yada, Tokyo (JP); Kentarou Gotou, Tokyo (JP)

(73) Assignee: JSR Corporation, Tokyo (JP)

( * ) Notice: Subject to any disclaimer, the term of this patent is extended or adjusted under 35 U.S.C. 154(b) by 130 days.

(21) Appl. No.: 11/235,101

(22) Filed: Sep. 27, 2005

(65) Prior Publication Data

US 2006/0078821 A1 Apr. 13, 2006

(30) Foreign Application Priority Data

| Sep. 28, 2004 | (JP) | ............................. 2004-280996 |
| May 10, 2005 | (JP) | ............................. 2005-137736 |
| Jul. 24, 2005 | (JP) | ............................. 2005-218054 |

(51) Int. Cl.
G03F 7/004 (2006.01)

(52) U.S. Cl. .................. 430/270.1; 430/905; 430/910; 430/926

(58) Field of Classification Search ............ 430/270.1, 430/905, 910, 926
See application file for complete search history.

(56) References Cited

U.S. PATENT DOCUMENTS

| 4,491,628 | A | | 1/1985 | Ito et al. ..................... 430/176 |
| 6,159,656 | A | * | 12/2000 | Kawabe et al. .......... 430/270.1 |
| 6,180,316 | B1 | * | 1/2001 | Kajita et al. ............. 430/270.1 |
| 6,723,483 | B1 | * | 4/2004 | Oono et al. ................. 430/170 |
| 6,830,868 | B2 | * | 12/2004 | Nagai et al. ............. 430/270.1 |
| 2002/0155383 | A1 | | 10/2002 | Fujimori et al. ......... 430/282.1 |

FOREIGN PATENT DOCUMENTS

| EP | 0 726 500 A1 | 8/1996 |
| EP | 0 952 489 A1 | 10/1999 |
| EP | 1 048 983 A1 | 11/2000 |
| EP | 1 238 972 A1 | 9/2002 |
| EP | 0 967 522 B1 | 2/2003 |
| JP | 02-27660 | 6/1990 |
| JP | 08-217815 | 8/1996 |
| JP | 10-120628 | 12/1998 |

* cited by examiner

*Primary Examiner*—John S. Chu
(74) *Attorney, Agent, or Firm*—Merchant & Gould, P.C.; Christopher W. Raimund

(57) ABSTRACT

A positive-tone radiation-sensitive resin composition containing an anthracene-based carboxylic acid component with low sublimation properties and excellent compatibility with other components is provided. The composition exhibits optimum controllability of radiation transmittance as a chemically amplified positive-tone resist effectively responding to active radiation, particularly to deep ultraviolet rays, effectively controlling line width variation in resist patterns due to fluctuation in the resist film thickness on a highly refractive substrate, and exhibiting excellent focal depth allowance.

The composition comprises (A) an anthracene derivative of the following formula (1), (B) a photoacid generator comprising a sulfonimide compound, and, (C) a resin containing an acid-dissociable group,

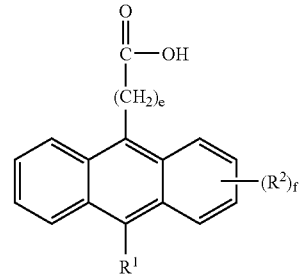

(1)

wherein $R^1$ is a hydrogen atom or a monovalent organic group, $R^2$ is a monovalent organic group, e is an integer of 0-3, and f is an integer of 0-8.

The metal impurity content in the component (A), in terms of the total ion content, is preferably 5,000 ppb or less.

23 Claims, No Drawings

POSITIVE-TONE RADIATION-SENSITIVE RESIN COMPOSITION

TECHNICAL FIELD

The present invention relates to a positive-tone radiation-sensitive resin composition suitably used as a chemically-amplified positive resist useful for microfabrication utilizing active radiation, particularly deep ultraviolet rays represented by a KrF excimer laser, an ArF excimer laser, and an $F_2$ excimer laser.

BACKGROUND ART

In the field of microfabrication represented by fabrication of integrated circuit devices, photolithographic technology enabling microfabrication with a line width of 0.20 μm or less has been demanded in recent years in order to achieve a higher degree of integration.

A conventional photolithographic process utilizes near ultraviolet rays such as i-line radiation. It is known in the art that microfabrication with a line width of a sub-quarter micron order using near ultraviolet rays is very difficult.

Therefore, use of radiation with a shorter wavelength has been studied for enabling microfabrication with a line width of 0.20 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm), an ArF excimer laser (wavelength: 193 nm), and an $F_2$ excimer laser (wavelength: 157 nm) have attracted attention.

As a resist applicable to the shorter wavelength radiations, a number of resists utilizing a chemical amplification effect between a component having an acid-dissociable functional group and a photoacid generator which generates an acid upon irradiation (hereinafter called "exposure") has been proposed. Such a resist is hereinafter called a chemically amplified resist.

As a chemically amplified resist, Japanese Patent Publication No. 27660/1990 discloses a composition comprising a polymer having a t-butyl ester group of a carboxylic acid or t-butylcarbonate group of phenol and a photoacid generator. This composition utilizes the effect of the polymer to release a t-butyl ester group or t-butyl carbonate group by the action of an acid generated upon exposure to form an acidic functional group such as a carboxylic group or a phenolic hydroxyl group, which renders an exposed area on a resist film readily soluble in an alkaline developer.

In recent years, in addition to high limit resolution and high process margin, a high sensitivity to radiations is demanded of chemically amplified resists as a factor determining productivity of a photolithographic process.

Reducing the amount of basic substance which is a component of chemically amplified resists is one of the methods of increasing the sensitivity of the chemically amplified resists. This method, however, not only involves a decrease in the amount of acids produced by a photoacid generator, which gives rise to unduly roughened pattern surfaces, but also impairs environmental resistance of the resist such as poor PED stability, which is an indication of line width stability against a fluctuated period of time from exposure to post heat treatment. One method for obviating this problem is to increase the amount of photoacid generator. However, an increased amount of photoacid generator decreases radiation transmissivity through resist films, resulting in a tendency of easily producing a trapezoid pattern profile rather than a desirable rectangular pattern profile.

As a method for improving performance of a chemically amplified resist using an anthracene additive, Japanese Patent Application Laid-open No. 1996-217815 discloses that the addition of anthracene derivatives such as anthracene-9-methanol, anthracene-9-carboxyethyl, and anthracene-9-carboxy-n-butyl to chemically-amplified radiation-sensitive resin compositions is effective in improving particularly a halation prevention effect. Japanese Patent Publication Laid-open 1998-120628 discloses that a chemically-amplified positive-tone resist material containing a carboxylic acid derivative having a tricyclo-aromatic skeleton such as an anthracene skeleton and a carboxyl group protected by an unstable acid group can suppress standing wave and halation.

The methods disclosed in these patents, however, lack investigation into other important aspects such as control of line width variations in resist patterns due to fluctuation of the resist film thickness on a highly reflective substrate (Si-substrate, etc.) and process margins such as improvement of depth of focus. Overall characteristics as a chemically amplified resist for radiation-sensitive resin compositions or positive-tone resist materials are not necessarily sufficient.

An object of the present invention is to provide a positive-tone radiation-sensitive resin composition containing an anthracene-based carboxylic acid component with low sublimation properties and excellent compatibility with other components, the composition exhibiting optimum controllability of radiation transmittance as a chemically amplified positive-tone resist effectively responding to active radiation, particularly to deep ultraviolet rays, effectively controlling line width variation in resist patterns due to fluctuation in the resist film thickness on a highly refractive substrate, and exhibiting good sensitivity, resolution, and excellent focal depth allowance.

SUMMARY OF THE INVENTION

The present invention relates to a positive tone radiation-sensitive resin composition comprising:

(A) an anthracene derivative of the following formula (1),

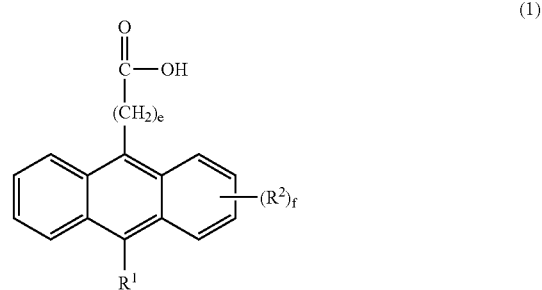

wherein $R^1$ represents a hydrogen atom or a monovalent organic group having 1-12 carbon atoms, $R^2$ individually represents a monovalent organic group having 1-12 carbon atoms, e indicates an integer of 0-3, and f is an integer of 0-8, (B) a photoacid generator comprising a sulfonimide compound, and (C) a resin containing an acid-dissociable group which is insoluble or scarcely soluble in alkali, but becomes soluble in alkali when the acid-dissociable group dissociates.

DETAILED DESCRIPTION OF THE INVENTION AND PREFERRED EMBODIMENTS

The present invention is described below in detail.

Anthracene Derivative (A):

The component (A) of the present invention is an anthracene derivative represented by the above formula (1) (hereinafter referred to as "anthracene derivative (A)").

In formula (1), e is preferably 0 or 1 and particularly preferably 0.

As examples of the hydrogen atom or monovalent organic group having 1-12 carbon atoms represented by $R^1$ in formula (1), —$(CH_2)_g$—C(=O)OH (wherein g is a whole number of 0-3) and the following other monovalent organic groups can be given.

In the group —$(CH_2)_g$—C(=O)OH, g is preferably 0 or 1 and particularly preferably 0.

As examples of the other monovalent organic groups represented by $R^1$ in the formula (1), alkyl groups such as a methyl group, ethyl group, n-propyl group, i-propyl group, n-butyl group, t-butyl group, n-pentyl group, n-hexyl group, n-octyl group, n-decyl group, cyclopentyl group, and cyclohexyl group; aryl groups such as a phenyl group, o-tolyl group, m-tolyl group, p-tolyl group, and 1-naphthyl group; aralkyl groups such as a benzyl group and phenethyl group; alkoxyl groups such as a methoxy group, ethoxy group, n-propoxy group, i-propoxy group, n-butoxy group, t-butoxy group, n-pentyloxy group, n-hexyloxy group, n-octyloxy group, n-decyloxy group, cyclopentyloxy group, and cyclohexyloxy group; aryloxy groups such as a phenoxy group, o-tolyloxy group, m-tolyloxy group, p-tolyloxy group, and 1-naphthyloxy group; aralkyloxy groups such as a benzyloxy group and phenethyloxy group; alkoxymethyl groups such as a methoxymethyl group, ethoxymethyl group, n-propoxymethyl group, i-propoxymethyl group, n-butoxymethyl group, t-butoxymethyl group, n-pentyloxymethyl group, n-hexyloxymethyl group, n-octyloxymethyl group, n-decyloxymethyl group, cyclopentyloxymethyl group, and cyclohexyloxymethyl group; aryloxymethyl groups such as a phenoxymethyl group, o-tolyloxymethyl group, m-tolyloxymethyl group, p-tolyloxymethyl group, and 1-naphthyloxymethyl group; aralkyloxymethyl groups such as a benzyloxymethyl group and phenethyloxymethyl group; a carboxyl group; alkoxycarbonyl groups such as a methoxycarbonyl group, ethoxycarbonyl group, n-propoxycarbonyl group, i-propoxycarbonyl group, n-butoxycarbonyl group, t-butoxycarbonyl group, n-pentyloxycarbonyl group, n-hexyloxycarbonyl group, n-octyloxycarbonyl group, n-decyloxycarbonyl group, cyclopentyloxycarbonyl group, and cyclohexyloxycarbonyl group; aryloxycarbonyl groups such as a phenoxycarbonyl group, o-tolyloxycarbonyl group, m-tolyloxycarbonyl group, p-tolyloxycarbonyl group, and 1-naphthyloxycarbonyl group; aralkyloxycarbonyl groups such as a benzyloxycarbonyl group and phenethyloxycarbonyl group; a carboxymethyl group; alkoxycarbonylmethyl groups such as a methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, n-pentyloxycarbonylmethyl group, n-hexyloxycarbonylmethyl group, n-octyloxycarbonylmethyl group, n-decyloxycarbonylmethyl group, cyclopentyloxycarbonylmethyl group, and cyclohexyloxycarbonylmethyl group; aryloxycarbonylmethyl groups such as a phenoxycarbonylmethyl group, o-tolyloxycarbonylmethyl group, m-tolyloxycarbonylmethyl group, p-tolyloxycarbonylmethyl group, and 1-naphthyloxycarbonylmethyl group; aralkyloxycarbonylmethyl groups such as a benzyloxycarbonylmethyl group and phenethyloxycarbonylmethyl group; and the like can be given.

Of these monovalent organic groups, methyl group, ethyl group, methoxymethyl group, carboxyl group, methoxycarbonyl group, t-butoxycarbonyl group, carboxymethyl group, methoxycarbonylmethyl group, t-butoxycarbonylmethyl group, and the like are preferable.

As $R^1$ in the formula (1), a hydrogen atom, carboxyl group, carboxymethyl group, t-butoxycarbonylmethyl group, and the like are particularly preferable.

As examples of the monovalent organic group having 1-12 carbon atoms represented by $R^2$ in the formula (1), the same examples given for the monovalent organic group having 1-12 carbon atoms represented by $R^1$ can be given.

Of these monovalent organic groups, methyl group, ethyl group, methoxymethyl group, carboxyl group, methoxycarbonyl group, t-butoxycarbonyl group, carboxymethyl group, methoxycarbonylmethyl group, t-butoxycarbonylmethyl group, and the like are preferable.

In formula (1), f is preferably 0 or 1 and particularly preferably 0.

As specific preferable examples of the anthracene derivative (A), anthracene-9-carboxylic acid, anthracene-9,10-dicarboxylic acid, 10-carboxymethylanthracene-9-carboxylic acid, 10-methoxycarbonylanthracene-9-carboxylic acid, 10-t-butoxycarbonylanthracene-9-carboxylic acid, 10-methoxycarbonylmethylanthracene-9-carboxylic acid, 10-t-butoxycarbonylmethylanthracene-9-carboxylic acid, and the like can be given.

Of these anthracene derivatives (A), anthracene-9-carboxylic acid, anthracene-9,10-dicarboxylic acid, 10-carboxymethylanthracene-9-carboxylic acid, 10-t-butoxycarbonylmethylanthracene-9-carboxylic acid, and the like are even more preferable, and anthracene-9-carboxylic acid, anthracene-9,10-dicarboxylic acid, and the like are particularly preferable.

In the present invention, the anthracene derivatives (A) may be used either individually or in combination of two or more.

The anthracene derivative (A) of the present invention has the highest purity possible in order to ensure only a small amount of metal impurities and solution impurities are present in the composition solution for the later described radiation sensitive resin composition when the anthracene derivative is dissolved in a solvent (specifically, insoluble impurities).

It is believed that these metal impurities originate from the potassium hydroxide and sodium hydroxide used in the synthesis of the anthracene derivative (A) and the solution impurities are impurities that contain a sodium ion or potassium ion.

Specifically, the metal impurity content of the anthracene derivative (A) of the present invention preferably comprises a total ion content of 5,000 ppb or less and particularly preferably 500 ppb or less. Even more specifically, the metal impurity content of the anthracene derivative (A) comprises a sodium ion content of preferably 500 ppb or less and particularly preferably 100 ppb or less, a potassium ion content of preferably 500 ppb or less and particularly preferably 100 ppb or less, and an iron (III) ion content of preferably 500 ppb or less and particularly preferably 100 ppb or less. If the metal impurity content is greater than the specified amount, the photolithography machine and resulting semiconductor chip become contaminated during formation of the resist pattern thereby possibly reducing yield and product quality.

The number of solution impurities having a maximum length of 0.25 μm or more in a 10 ml solution of 1 g of the anthracene derivative (A) dissolved in 100 g of ethyl acetate is preferably 50 or less and particularly preferably 20 or less. If the number of solution impurities exceeds this amount, development defects may occur during formation of the resist pattern.

As examples of a method for refining an impure anthracene derivative (A), a separatory cleaning method, reprecipitation method, and the like can be given, with the reprecipitation method being preferable.

In the separation cleaning method, a solution (a) of the anthracene derivative (A) dissolved in a solvent (α) is mixed with an aqueous solution of an acid compound (β), and after the impurities are caused to move to the water layer, the solution (a) is separated and washed with purified water to obtain an organic layer, and the solvent (α) is removed from the organic layer to obtain a refined anthracene derivative (A).

Any solvent in which the anthracene derivative (A) is soluble that is not compatible with water may be used as the solvent (α). As examples of the solvent (α), ketones such as 2-pentanone, 3-pentanone, 2-heptanone, 3-heptanone, and 4-heptanone; esters such as ethyl acetate, n-propyl acetate, n-butyl acetate, n-pentyl acetate, and propylene glycol monomethylether acetate; alkyl halides such as chloroform, methylene chloride, carbon tetrachloride, and bromoform; aromatic hydrocarbons such as benzene, toluene, and xylene; aliphatic hydrocarbons such as n-pentane, n-hexane, and n-heptane; ethers such as diethyl ether; petroleum ether, benzine, and the like can be given.

Of these solvents (α), 2-heptanone, ethyl acetate, n-butyl acetate, propylene glycol monomethylether acetate, methylene chloride, and the like are preferable.

These solvents (α) may be used either individually or in combination of two or more.

The concentration of the anthracene derivative (A) in the solution (a) is usually 2-10 wt % and preferably 2-5 wt %.

As an example of the acid compound (β), an acid having a pKa lower than that of the anthracene derivative (A), preferably a pKa of 3.0 or less, and particularly preferably a pKa of 2.0 or less can be given.

As preferable examples of the acid compound (β), hydrochloric acid, sulfuric acid, nitric acid, oxalic acid, chloroacetic acid, dichloroacetic acid, trichloroacetic acid, and p-toluenesulfonic acid can be given. These acid compounds (β) may be used either individually or in combination of two or more.

The concentration of the acid compound (β) in the aqueous solution is usually 0.1-10 wt % and preferably 1-5 wt %.

The weight ratio of the solution (a) to the acid compound (β) in the separation cleaning method is usually 1:0.1-10 and preferably 1:0.3-3.

In the reprecipitation method, a solution (b) of the anthracene derivative (A) dissolved in a solvent (γ), which is compatible with water, is added to an aqueous solution of the acid compound (>) by dripping, and after selectively precipitating the anthracene derivative (A), the precipitate is collected and washed to obtain a refined anthracene derivative (A).

Any solvent in which the anthracene derivative (A) is soluble that is compatible with water may be used as the solvent (γ). As examples of the solvent (γ), polar solvents such as an acetone, methylethyl ketone, tetrahydrofuran, dimethyl formamide, dimethyl sulfoxide, methanol, and ethanol can be given.

Of these solvents (γ), acetone, tetrahydrofuran, and the like are preferable.

These solvents (γ) may be used either individually or in combination of two or more.

The concentration of the anthracene derivative (A) in the solution (b) is usually 2-30 wt % and preferably 5-20 wt %.

As examples and preferable examples of the acid compound (β) used in the reprecipitation method, the examples and preferable examples given for the acid compound (β) in the separation cleaning method can be given.

These acid compounds (β) may be used either individually or in combination of two or more.

The concentration of the acid compound (β) in the aqueous solution is usually 0.1-10 wt % and preferably 1-5 wt %.

The weight ratio of the solution (b) to the acid compound (>) in the reprecipitation method is usually 1:1-30 and preferably 1:2-15.

As examples of the cleaning solvent used in the washing of the last step of the reprecipitation method, purified water and an other solvent (δ) can be given. When the other solvent (δ) is used, further washing with purified water is preferably conducted.

The amount of the anthracene derivative (A) used in the present invention is preferably 0.1-40 parts by weight, more preferably 0.2-20 parts by weight, and particularly preferably 1-10 parts by weight for 100 parts by weight of the later-described acid-dissociable group-containing resin (C). If the anthracene derivative (A) is used in an amount less than the above range, the effect of suppressing line width variation of the resist pattern due to fluctuation in resist film thickness and the effect of improving focal depth allowance tend to decrease. On the other hand, if the amount exceeds the above range, sensitivity tends to decrease.

Other Dyes

The positive-tone radiation-sensitive resin composition may comprise dyes other than the anthracene derivative (A) (hereinafter referred to as "(D) other dyes").

As the other dyes, dyes having a high absorbency of deep ultraviolet rays are preferable, for example, other anthracene derivatives such as methoxycarbonylmethyl anthracene-9-carboxylic acid, t-butoxycarbonylmethyl anthracene-9-carboxylic acid, 9-methoxycarbonylmethyl anthracene, and 9-t-butoxycarbonylmethyl anthracene; carbazole derivatives such as 9-carbazole acetic acid, N-(methoxycarbonylmethyl)carbazole, and N-(t-butoxycarbonylmethyl)carbazole; benzophenone derivatives such as benzophenone-2-carboxylic acid, benzophenone-4-carboxylic acid, t-butoxycarbonylmethyl benzophenone-2-carboxylic acid, and t-butoxycarbonylmethyl benzophenone-4-carboxylic acid; and the like can be given.

In the present invention, the above other dyes can be used either individually or in combination of two or more.

The proportion of the other dyes used is usually 15 wt % or less, and preferably 10 wt % or less of the total amount of the anthracene derivative (A) and other dyes. If the other dyes are used in an amount exceeding the above range, the expected effect of the present invention may be impaired.

Acid Generator (B)

The component (B) of the present invention is a photoacid generator which contains a sulfonimide compound as an essential component and generates an acid upon exposure (hereinafter referred to as "acid generator (B)").

As examples of the sulfonimide compound, compounds of the following formula (7) can be given:

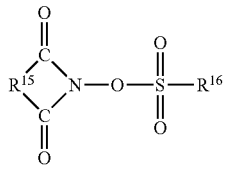
(7)

wherein $R^{15}$ represents a divalent group such as an alkylene group, arylene group, and alkoxylene group, and $R^{16}$ represents a monovalent group such as an alkyl group, aryl group, halogenated alkyl group, and halogenated aryl group.

Specific examples of sulfonimide compounds include:
N-(trifluoromethanesulfonyloxy)succinimide,
N-(trifluoromethanesulfonyloxy)phthalimide,
N-(trifluoromethanesulfonyloxy)diphenylmaleimide,
N-(trifluoromethanesulfonyloxy)bicyclo[2.2.1]hept-5-ene-2,3-dicarboxyimide,
N-(trifluoromethanesulfonyloxy)-7-oxabicyclo[2.2.1]hept-5-ene-2,3-dicarboxyimide,
N-(trifluoromethanesulfonyloxy)bicyclo[2.2.1]heptan-5,6-oxy-2,3-dicarboxyimide,
N-(trifluoromethanesulfonyloxy)naphthylimide,
N-(10-camphorsulfonyloxy)succinimide, N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-[(5-methyl-5-carboxymethylbicyclo[2.2.1]heptan-2-yl)sulfonyloxy]succinimide,
N-(n-octanesulfonyloxy)succinimide, N-(n-octanesulfonyloxy)phthalimide,
N-(n-octanesulfonyloxy)diphenylmaleimide,
N-(n-octanesulfonyloxy)bicyclo[2.2.1]hept-5-ene-2,3-dicarboxyimide,
N-(n-octanesulfonyloxy)-7-oxabicyclo[2.2.1]hept-5-ene-2,3-dicarboxyimide,
N-(n-octanesulfonyloxy)bicyclo[2.2.1]heptan-5,6-oxy-2,3-dicarboxyimide,
N-(n-octanesulfonyloxy)naphthylimide, N-(p-toluenesulfonyloxy)succinimide,
N-(p-toluenesulfonyloxy)phthalimide, N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide,
N-(p-toluenesulfonyloxy)bicyclo[2.2.1]heptan-5,6-oxy-2,3-dicarboxyimide,
N-(p-toluenesulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy)diphenylmaleimide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo[2.2.1]hept-5-ene-2,3-dicarboxyimide,
N-(2-trifluoromethylbenzenesulfonyloxy)bicyclo[2.2.1]heptan-5,6-oxy-2,3-dicarboxyimide, N-(2-trifluoromethylbenzenesulfonyloxy)naphthylimide,
N-(4-trifluoromethylbenzenesulfonyloxy)succinimide,
N-(4-trifluoromethylbenzenesulfonyloxy)phthalimide,
N-(4-trifluoromethylbenzenesulfonyloxy)diphenylmaleimide,
N-(4-trifluoromethylbenzenesulfonyloxy)bicyclo[2.2.1]hept-5-ene-2,3-dicarboxyimide,
N-(4-trifluoromethylbenzenesulfonyloxy)-7-oxabicyclo[2.2.1]hept-5-ene-2,3-dicarboxyimide,
N-(4-trifluoromethylbenzenesulfonyloxy)bicyclo[2.2.1]heptan-5,6-oxy-2,3-dicarboxyimide, N-(4-trifluoromethylbenzenesulfonyloxy)naphthylimide,
N-(perfluorobenzenesulfonyloxy)succinimide,
N-(perfluorobenzenesulfonyloxy)phthalimide,
N-(perfluorobenzenesulfonyloxy)diphenylmaleimide,
N-(perfluorobenzenesulfonyloxy)bicyclo[2.2.1]hept-5-ene-2,3-dicarboxyimide,
N-(perfluorobenzenesulfonyloxy)-7-oxabicyclo[2.2.1]hept-5-ene-2,3-dicarboxyimide,
N-(perfluorobenzenesulfonyloxy)bicyclo[2.2.1]heptan-5,6-oxy-2,3-dicarboxyimide,
N-(perfluorobenzenesulfonyloxy)naphthylimide,
N-(1-naphthalenesulfonyloxy)succinimide, N-(1-naphthalenesulfonyloxy)phthalimide,
N-(1-naphthalenesulfonyloxy)diphenylmaleimide,
N-(1-naphthalenesulfonyloxy)bicyclo[2.2.1]hept-5-ene-2,3-dicarboxyimide,
N-(1-naphthalenesulfonyloxy)-7-oxabicyclo[2.2.1]hept-5-ene-2,3-dicarboxyimide,
N-(1-naphthalenesulfonyloxy)bicyclo[2.2.1]heptan-5,6-oxy-2,3-dicarboxyimide,
N-(1-naphthalenesulfonyloxy)naphthylimide,
N-(nonafluoro-n-butanesulfonyloxy)succinimide,
N-(nonafluoro-n-butanesulfonyloxy)phthalimide,
N-(nonafluoro-n-butanesulfonyloxy)diphenylmaleimide,
N-(nonafluoro-n-butanesulfonyloxy)bicyclo[2.2.1]hept-5-ene-2,3-dicarboxyimide,
N-(nonafluoro-n-butanesulfonyloxy)-7-oxabicyclo[2.2.1]hept-5-ene-2,3-dicarboxyimide,
N-(nonafluoro-n-butanesulfonyloxy)bicyclo[2.2.1]heptan-5,6-oxy-2,3-dicarboxyimide,
N-(nonafluoro-n-butanesulfonyloxy)naphthylimide,
N-(perfluoro-n-ocanesulfonyloxy)succinimide,
N-(perfluoro-n-octanesulfonyloxy)phthalimide,
N-(perfluoro-n-octanesulfonyloxy)diphenylmaleimide,
N-(perfluoro-n-octanesulfonyloxy)bicyclo[2.2.1]hept-5-ene-2,3-dicarboxyimide,
N-(perfluoro-n-octanesulfonyloxy)-7-oxabicyclo[2.2.1]hept-5-ene-2,3-dicarboxyimide,
N-(perfluoro-n-octanesulfonyloxy)bicyclo[2.2.1]heptan-5,6-oxy-2,3-dicarboxyimide,
N-(perfluoro-n-octanesulfonyloxy)naphthylimide, N-(benzenesulfonyloxy)succinimide,
N-(benzenesulfonyloxy)phthalimide, N-(benzenesulfonyloxy)diphenylmaleimide,
N-(benzenesulfonyloxy)bicyclo[2.2.1]hept-5-ene-2,3-dicarboxyimide,
N-(benzenesulfonyloxy)-7-oxabicyclo[2.2.1]hept-5-ene-2,3-dicarboxyimide, N-(benzenesulfonyloxy)bicyclo[2.2.1]heptan-5,6-oxy-2,3-dicarboxyimide, and N-(benzenesulfonyloxy)naphthylimide.

Of these sulfonimide compounds,

N-(trifluoromethanesulfonyloxy)bicyclo[2.2.1]hept-5-ene-2,3-dicarboxyimide,

N-(10-camphorsulfonyloxy)succinimide, N-(p-toluenesulfonyloxy)succinimide,

N-(nonafluoro-n-butanesulfonyloxy)bicyclo[2.2.1]hept-5-ene-2,3-dicarboxyimide,

N-(benzenesulfonyloxy)bicyclo[2.2.1]hept-5-ene-2,3-dicarboxyimide,

N-[(5-methyl-5-carboxymethylbicyclo[2.2.1]heptan-2-yl)sulfonyloxy]succinimide, and the like are preferable.

In the present invention, the sulfonimide compounds may be used either individually or in combination of two or more.

In the present invention, photoacid generators (hereinafter referred to as "other acid generators") other than the sulfonimide compound can be used in combination with the acid generator (B).

As examples of the other acid generators, onium salt compounds, sulfone compounds, sulfonate compounds, disulfonyl diazomethane compounds, disulfonylmethane compounds, oxime sulfonate compounds, and hydrazine sulfonate compounds can be given.

As examples of the onium salt compound, sulfonium salts, iodonium salts, phosphonium salts, diazonium salts, ammonium salts, and pyridinium salts can be given.

Specific examples of the onium salt include: triphenylsulfonium trifluoromethanesulfonate, triphenylsulfonium nonafluoro-n-butanesulfonate, triphenylsulfonium perfluoro-n-octanesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, triphenylsulfonium 2-trifluoromethylbenzenesulfonate, triphenylsulfonium 4-trifluoromethylbenzenesulfonate, triphenylsulfonium hexafluoroantimonate, triphenylsulfonium naphthalenesulfonate, triphenylsulfonium perfluorobenzenesulfonate, (4-t-butylphenyl)diphenylsulfonium trifluoromethanesulfonate, (4-t-butylphenyl)diphenylsulfonium nonafluoro-n-butanesulfonate, (4-t-butylphenyl)diphenylsulfonium perfluoro-n-octanesulfonate, (4-t-butylphenyl)diphenylsulfonium pyrenesulfonate, (4-t-butylphenyl)diphenylsulfonium n-dodecylbenzenesulfonate, (4-t-butylphenyl)diphenylsulfonium p-toluenesulfonate, (4-t-butylphenyl)diphenylsulfonium benzenesulfonate, (4-t-butylphenyl)diphenylsulfonium 10-camphorsulfonate, (4-t-butylphenyl)diphenylsulfonium n-octanesulfonate, (4-t-butylphenyl)diphenylsulfonium 2-trifluoromethylbenzenesulfonate, (4-t-butylphenyl)diphenylsulfonium 4-trifluoromethanebenzenesulfonate, (4-t-butylphenyl)diphenylsulfonium perfluorobenzenesulfonate, (4-t-butoxyphenyl)diphenylsulfonium trifluoromethanesulfonate, (4-t-butoxyphenyl)diphenylsulfonium nonafluoro-n-butanesulfonate, (4-t-butoxyphenyl)diphenylsulfonium perfluoro-n-octanesulfonate, (4-t-butoxyphenyl)diphenylsulfonium pyrenesulfonate, (4-t-butoxyphenyl)diphenylsulfonium n-dodecylbenzenesulfonate, (4-t-butoxyphenyl)diphenylsulfonium p-toluenesulfonate, (4-t-butoxyphenyl)diphenylsulfonium benzenesulfonate, (4-t-butoxyphenyl)diphenylsulfonium 10-camphorsulfonate, (4-t-butoxyphenyl)diphenylsulfonium n-octanesulfonate, (4-t-butoxyphenyl)diphenylsulfonium 2-trifluoromethylbenzenesulfonate, (4-t-butoxyphenyl)diphenylsulfonium 4-trifluoromethylbenzenesulfonate, (4-t-butoxyphenyl)diphenylsulfonium perfluorobenzenesulfonate, (4-hydroxyphenyl)diphenylsulfonium trifluoromethanesulfonate, (4-hydroxyphenyl)diphenylsulfonium nonafluoro-n-butanesulfonate, (4-hydroxyphenyl)diphenylsulfonium perfluoro-n-octanesulfonate, (4-hydroxyphenyl)diphenylsulfonium pyrenesulfonate, (4-hydroxyphenyl)diphenylsulfonium n-dodecylbenzenesulfonate, (4-hydroxyphenyl)diphenylsulfonium p-toluenesulfonate, (4-hydroxyphenyl)diphenylsulfonium benzenesulfonate, (4-hydroxyphenyl)diphenylsulfonium 10-camphorsulfonate, (4-hydroxyphenyl) diphenylsulfonium n-octanesulfonate, (4-hydroxyphenyl) diphenylsulfonium 2-trifluoromethylbenzenesulfonate, (4-hydroxyphenyl)diphenylsulfonium 4-trifluoromethylbenzenesulfonate, (4-hydroxyphenyl)diphenylsulfonium perfluorobenzenesulfonate, tris(4-methoxyphenyl)sulfonium trifluoromethanesulfonate, tris(4-methoxyphenyl)sulfonium nonafluoro-n-butanesulfonate, tris(4-methoxyphenyl) sulfonium perfluoro-n-octanesulfonate, tris(4-methoxyphenyl)sulfonium pyrenesulfonate, tris(4-methoxyphenyl)sulfonium n-dodecylbenzenesulfonate, tris (4-methoxyphenyl)sulfonium p-toluenesulfonate, tris(4-methoxyphenyl)sulfonium benzenesulfonate, tris(4-methoxyphenyl)sulfonium 10-camphorsulfonate, tris(4-methoxyphenyl) sulfonium n-octanesulfonate, tris(4-methoxyphenyl)sulfonium 2-trifluoromethylbenzenesulfonate, tri(4-methoxyphenyl) sulfonium 4-trifluoromethylbenzenesulfonate, tris(4-methoxyphenyl)sulfonium perfluorobenzenesulfonate, bis(4-methoxyphenyl) p-tolylsulfonium trifluoromethanesulfonate, bis(4-methoxyphenyl) p-tolylsulfonium nonafluoro-n-butanesulfonate, bis(4-methoxyphenyl) p-tolylsulfonium perfluoro-n-octanesulfonate, bis (4-methoxyphenyl) p-tolylsulfonium pyrenesulfonate, bis (4-methoxyphenyl) p-tolylsulfonium n-dodecylbenzenesulfonate, bis(4-methoxyphenyl) p-tolylsulfonium p-toluenesulfonate, bis(4-methoxyphenyl) p-tolylsulfonium benzenesulfonate, bis(4-methoxyphenyl) p-tolylsulfonium 10-camphorsulfonate, bis(4-methoxyphenyl) p-tolylsulfonium n-octanesulfonate, bis(4-methoxyphenyl) p-tolylsulfonium 2-trifluoromethylbenzenesulfonate, bis(4-methoxyphenyl) p-tolylsulfonium 4-trifluoromethylbenzenesulfonate, bis(4-methoxyphenyl) p-tolylsulfonium perfluorobenzenesulfonate, (4-fluorophenyl)diphenylsulfonium trifluoromethanesulfonate, (4-fluorophenyl)diphenylsulfonium nonafluoro-n-butanesulfonate, (4-fluorophenyl)diphenylsulfonium 10-camphorsulfonate, tris(4-fluorophenyl)sulfonium trifluoromethanesulfonate, tris(4-fluorophenyl)sulfonium nonafluoro-n-butanesulfonate, tris (4-fluorophenyl)sulfonium 10-camphorsulfonate, tris(4-fluorophenyl)sulfonium p-toluenesulfonate, 2,4,6-trimethylphenyldiphenylsulfonium trifluoromethanesulfonate, 2,4,6-trimethylphenyldiphenylsulfonium 2,4-difluorobenzenesulfonate, 2,4,6-trimethylphenyldiphenylsulfonium 4-trifuruoromethylbenzenesulfonate, 2,4,6-trimethylphenyldiphenylsulfonium p-toluenesulfonate, diphenyliodonium trifluoromethanesulfonate, diphenyliodonium nonafluoro-n-butanesufonate, diphenyliodonium perfluoro-n-octanesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, diphenyliodonium 2-trifluoromethylbenzenesulfonate, diphenyliodonium 4-trifluoromethylbenzenesulfonate, diphenyliodonium perfluorobenzenesulfonate, di(p-tolyl)iodonium trifluoromethanesulfonate, di(p-tolyl)iodonium nonafluoro-n-butanesulfonate, di(p-tolyl)iodonium perfluoro-n-octanesulfonate, di(p-tolyl)iodonium pyrenesulfonate, di(p-tolyl)iodonium n-dodecylbenzenesulfonate, di(p-tolyl)iodonium p-toluenesulfonate, di(p-tolyl)iodonium benzenesulfonate, di(p-tolyl)iodonium 10-camphorsulfonate, di(p-tolyl)iodonium n-octanesulfonate, di(p-tolyl)iodonium 2-trifluoromethylbenzenesulfonate, di(p-tolyl)iodonium 4-trifluoromethylbenzenesulfonate, di(p-tolyl)iodonium perfluorobenzenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl)iodonium perfluorobenzenesulfonate, bis(4-t-butylphenyl)iodonium 2,4-difluorobenzenesulfonate, bis(3,4-dimethylphenyl)iodonium trifluoromethanesulfonate, bis(3,4-dimethylphenyl)iodonium nonafluoro-n-butanesulfonate, bis(3,4-dimethylphenyl)iodonium perfluoro-n-octanesulfonate, bis(3,4-dimethylphenyl)iodonium pyrenesulfonate, bis(3,4-dimethylphenyl)iodonium n-dodecylbenzenesulfonate, bis(3,4-dimethylphenyl)iodonium p-toluenesulfonate, bis(3,4-dimethylphenyl)iodonium benzenesulfonate, bis(3,4-dimethylphenyl)iodonium 10-camphorsulfonate, bis(3,4-dimethylphenyl)iodonium n-octanesulfonate, bis(3,4-dimethylphenyl)iodonium 2-trifluoromethylbenzenesulfonate, bis(3,4-dimethylphenyl)iodonium 4-trifluoromethylbenzenesulfonate, bis(3,4-dimethylphenyl)iodonium perfluorobenzenesulfonate, (4-nitrophenyl)phenyliodonium trifluoromethanesulfonate, (4-nitrophenyl)phenyliodonium nonafluoro-n-butanesulfonate, (4-nitrophenyl)phenyliodonium perfluoro-n-octanesulfonate, (4-nitrophenyl)phenyliodonium pyrenesulfonate, (4-nitrophenyl)phenyliodonium n-dodecylbenzenesulfonate, (4-nitrophenyl)phenyliodonium p-toluenesulfonate, (4-nitrophenyl)phenyliodonium benzenesulfonate, (4-nitrophenyl)phenyliodonium 10-camphorsulfonate, (4-nitrophenyl)phenyliodonium n-octanesulfonate, (4-nitrophenyl)phenyliodonium 2-trifluoromethylbenzenesulfonate, (4-nitrophenyl)phenyliodonium 4-trifluoromethylbenzenesulfonate, (4-nitrophenyl)phenyliodonium perfluorobenzenesulfonate, bis(3-nitrophenyl)iodonium trifluoromethanesulfonate, bis(3-nitrophenyl)iodonium nonafluoro-n-butanesulfonate, bis(3-nitrophenyl)iodonium perfluoro-n-octanesulfonate, bis(3-nitrophenyl)iodonium pyrenesulfonate, bis(3-nitrophenyl)iodonium n-dodecylbenzenesulfonate, bis(3-nitrophenyl)iodonium p-toluenesulfonate, bis(3-nitrophenyl)iodonium benzenesulfonate, bis(3-nitrophenyl)iodonium 10-camphorsulfonate, bis(3-nitrophenyl)iodonium n-octanesulfonate, bis(3-nitrophenyl)iodonium 2-trifluoromethylbenzenesulfonate, bis(3-nitrophenyl)iodonium 4-trifluoromethylbenzenesulfonate, bis(3-nitrophenyl)iodonium perfluorobenzenesulfonate, (4-methoxyphenyl)phenyliodonium trifluoromethanesulfonate, (4-methoxyphenyl)phenyliodonium nonafluoro-n-butanesulfonate, (4-methoxyphenyl)phenyliodonium perfluoro-n-octanesulfonate, (4-methoxyphenyl)phenyliodonium pyrenesulfonate, (4-methoxyphenyl)phenyliodonium n-dodecylbenzenesulfonate, (4-methoxyphenyl)phenyliodonium p-toluenesulfonate, (4-methoxyphenyl)phenyliodonium benzenesulfonate, (4-methoxyphenyl)phenyliodonium 10-camphorsulfonate, (4-methoxyphenyl)phenyliodonium n-octanesulfonate, (4-methoxyphenyl)phenyliodonium 2-trifluoromethylbenzenesulfonate, (4-methoxyphenyl)phenyliodonium 4-trifluoromethylbenzenesulfonate, (4-methoxyphenyl)phenyliodonium perfluorobenzenesulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate, bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, bis(4-chlorophenyl)iodonium trifluoromethane sulfonate, bis(4-chlorophenyl)iodonium nonafluoro-n-butanesulfonate, bis(4-chlorophenyl)iodonium perfluoro-n-octanesulfonate, bis(4-chlorophenyl)iodonium pyrenesulfonate, bis(4-chlorophenyl)iodonium n-dodecylbenzenesulfonate, bis(4-chlorophenyl)iodonium p-toluenesulfonate, bis(4-chlorophenyl)iodonium benzenesulfonate, bis(4-chlorophenyl)iodonium 10-camphorsulfonate, bis(4-chlorophenyl)iodonium n-octanesulfonate, bis(4-chlorophenyl)iodonium 2-trifluoromethylbenzenesulfonate, bis(4-chlorophenyl)iodonium 4-trifluoromethylbenzenesulfonate, bis(4-chlorophenyl)iodonium perfluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium pyrenesulfonate, bis(4-trifluoromethylphenyl)iodonium n-dodecylbenzenesulfonate, bis(4-trifluoromethylphenyl)iodonium p-toluenesulfonate, bis(4-trifluoromethylphenyl)iodonium benzenesulfonate, bis(4-trifluoromethylphenyl)iodonium 10-camphorsulfonate, bis(4-trifluoromethylphenyl)iodonium n-octanesulfonate, bis(4-trifluoromethylphenyl)iodonium 2-trifluoromethylbenzenesulfonate, bis(4-trifluoromethylphenyl)iodonium 4-trifluoromethylbenzenesulfonate, bis(4-trifluoromethylphenyl)iodonium perfluorobenzenesulfonate, di(1-naphthyl)iodonium trifluoromethanesulfonate, di(1-naphthyl)iodonium nonafluoro-n-butanesulfonate, di(1-naphthyl)iodonium perfluoro-n-octanesulfonate, di(1-naphthyl)iodonium pyrenesulfonate, di(1-naphthyl)iodonium n-dodecylbenzenesulfonate, di(1-naphthyl)iodonium p-toluenesulfonate, di(1-naphthyl)iodonium benzenesulfonate, di(1-naphthyl)iodonium 10-camphorsulfonate, di(1-naphthyl)iodonium n-octanesulfonate, di(1-naphthyl)iodonium 2-trifluoromethylbenzenesulfonate, di(1-naphthyl)iodonium 4-trifluoromethylbenzenesulfonate, di(1-naphthyl)iodonium perfluorobenzenesulfonate, and the like can be given.

As examples of the sulfone compound, β-ketosulfone, β-sulfonylsulfone, and α-diazo compounds of these compounds can be given.

As specific examples of sulfone compounds, phenacylphenylsulfone, mesitylphenacylsulfone, bis(phenylsulfonyl)methane, and 4-trisphenacylsulfone can be given.

As examples of the sulfonate compound, alkyl sulfonate, haloalkyl sulfonate, aryl sulfonate, and imino sulfonate can be given.

As specific examples of sulfonate compounds, benzointosylate, pyrogallol tris(trifluoromethanesulfonate), pyrogallol tris(nonafluoro-n-butanesufonate), pyrogallol tris(methanesulfonate), nitrobenzyl-9,10-diethoxyanthracene-2-sulfonate, α-methylolbenzointosylate, α-methylolbenzoin trifluoromethanesulfonate, α-methylolbenzoin n-octanesulfonate, α-methylolbenzoin n-dodecanesulfonate, and the like can be given.

As an example of a disulfonyldiazomethane compound, a compound shown by the following formula (8) can be given:

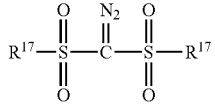

(8)

wherein $R^{17}$ individually represents a monovalent group such as an alkyl group, aryl group, halogenated alkyl group, and halogenated aryl group. As specific examples of disulfonyldiazomethane compounds, bis(t-butylsulfonyl)diazomethane, bis(trifluoromethanesulfonyl)diazomethane, bis(cyclohexanesulfonyl)diazomethane, bis(benzenesulfonyl)diazomethane, bis(p-toluenesulfonyl)diazomethane, bis(2,4-dimethylbenzenesulfonyl)diazomethane, bis(4-t-butylbenzenesulfonyl)diazomethane, bis(4-chlorobenzenesulfonyl)diazomethane, (methylsulfonyl)p-toluenesulfonyldiazomethane, (cyclohexanesulfonyl)p-toluenesulfonyldiazomethane, (cyclohexanelsulfonyl) 1,1-dimethylethanesulfonyldiazomethane, bis(1,1-dimethylethanesulfonyl)diazomethane, bis(1-methylethanesulfonyl)diazomethane, bis(3,3-dimethyl-1,5-dioxaspiro[5.5]dodecane-8-sulfonyl)diazomethane, and bis(1,4-dioxaspiro[4.5]decane-7-sulfonyl)diazomethane can be given.

As an example of a disulfonylmethane compound, a compound shown by the following formula (9) can be given:

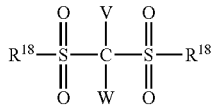

(9)

wherein $R^{18}$ individually represents a linear or branched monovalent aliphatic hydrocarbon group, a cycloalkyl group, aryl group, aralkyl group, or other monovalent organic groups having a hetero atom, V and W individually represent an aryl group, a hydrogen atom, a linear or branched monovalent aliphatic hydrocarbon group, or other monovalent organic groups having a hetero atom, provided that at least one of V and W represents an aryl group, or V and W bond to form a monocyclic or polycyclic carbon ring having at least one unsaturated bond, or V and W bond to form a group shown by the following formula:

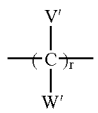

wherein V' and W' individually represent a hydrogen atom, halogen atom, linear or branched alkyl group, cycloalkyl group, aryl group, or aralkyl group, or V' and W', each bonding to the same or different carbon atoms, bond to form a monocyclic carbon ring, and r is an integer of 2-10.

As examples of the oxime sulfonate compound, compounds of the following formulas (10-1) or (10-2) can be given:

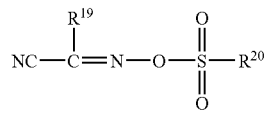

(10-1)

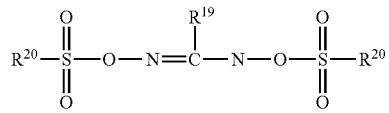

(10-2)

wherein $R^{19}$ and $R^{20}$ individually represent a monovalent organic group.

As specific preferable examples of $R^{19}$ in the formulas (10-1) and (10-2), a methyl group, ethyl group, n-propyl group, phenyl group, tosyl group, trifluoromethyl group, and pentafluoroethyl group can be given. As preferable examples of $R^{20}$, a phenyl group, tosyl group, and 1-naphthyl group can be given.

As specific examples of hydrazine sulfonate compounds, bis(benzenesulfonyl)hydrazine, bis(p-toluenesulfonyl)hydrazine, bis(trifluoromethanesulfonyl)hydrazine, bis(pentafluoroethanesulfonyl)hydrazine, bis(n-propanesulfonyl)hydrazine, benzenesulfonylhydrazine, p-toluenesulfonylhydrazine, trifluoromethanesulfonylhydrazine, pentafluoroethanesulfonylhydrazine, n-propanesulfonylhydrazine, and (trifluoromethanesulfonyl)p-toluenesulfonylhydrazine can be given.

As examples of preferable other acid generators to be used together with the sulfonimide compound in the present invention, triphenylsulfonium trifluoromethanesulfonate, triphenylsulfonium nonafluoro-n-butanesulfonate, triphenylsulfonium perfluoro-n-octanesulfonate, triphenylsulfonium p-toluenesulfonate, triphenylsulfonium 10-camphorsulfonate, triphenylsulfonium 2-trifluoromethylbenzenesulfonate, triphenylsulfonium 4-trifluorobenzenesulfonate, triphenylsulfonium 2,4-difluoromethylbenzenesulfonate, tris(4-methoxyphenyl)sulfonium trifluoromethanesulfonate, tris(4-methoxyphenyl)sulfonium nonafluoro-n-butanesulfonate, tris(4-methoxyphenyl)sulfonium 10-camphorsulfonate, (4-fluorophenyl)diphenylsulfonium trifluoromethanesulfonate, (4-fluorophenyl)diphenylsulfonium nonafluoro-n-butanesulfonate, (4-fluorophenyl)diphenylsulfonium 10-camphorsulfonate, tris(4-fluorophenyl)sulfonium trifluoromethanesulfonate, tris(4-fluorophenyl)sulfonium nonafluoro-n-butanesulfonate, tris(4-fluorophenyl)sulfonium 10-camphorsulfonate, 2,4,6-trimethylphenyl diphenylsulfonium trifluoromethanesulfonate, 2,4,6-trimethylphenyldiphenylsulfonium p-toluenesulfonate, 2,4,6-trimethylphenyldiphenylsulfonium 4-trifluorobenzenesulfonate, 2,4,6-trimethylphenyldiphenylsulfonium 2,4-difluorobenzenesulfonate, diphenyliodonium trifluoromethanesulfonate, diphenyliodonium nonafluoro-n-butanesulfonate, diphenyliodonium perfluoro-n-octanesulfonate, diphenyliodonium 10-camphorsulfonate, di(p-tolyl)iodonium trifluoromethanesulfonate, di(p-tolyl)iodonium nonafluoro-n-butanesulfonate, di(p-tolyl)iodonium 10-camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium p-toluenesulfonate, bis(4-t-butylphenyl)iodonium 10-camphorsulfonate, bis(4-t- butylphenyl)iodonium 2-trifluoromethylbenzenesulfonate, bis(4-t-butylphenyl)iodonium 4-trifluoromethylbenzenesulfonate, bis(4-t-butylphenyl)iodonium 2,4-difluorobenzenesulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate, bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, bis(cyclohexanesulfonyl)diazomethane, bis(1,1-dimethylethanesulfonyl)diazomethane, bis(3,3-dimethyl-1,5-dioxaspiro[5.5]dodecane-8-sulfonyl) diazomethane, bis(t-butylsulfonyl)diazomethane, bis(1,4-dioxaspiro[4.5]undecane-7-sulfonyl) diazomethane, and the like can be given.

These other acid generators may be used either individually or in combination of two or more.

The amount of the acid generator (B) used in the present invention is preferably 0.1-20 parts by weight, and more preferably 0.5-15 parts by weight, for 100 parts by weight of the acid-dissociable group-containing resin (C) mentioned later. If the acid generator (B) is used in an amount less than the above range, sensitivity and developability tend to decrease, and if used in an amount exceeding the above range, pattern formability and heat resistance tend to decrease.

The proportion of the other acid generators to be added is 30 wt % or less, and preferably 10 wt % or less of the total amount of acid generators (B). If the other acid generators are used in an amount exceeding the above range, the expected effect of the present invention may be impaired.

Acid-Dissociable Group-Containing Resin (C)

The component (C) of the present invention is an acid-dissociable group-containing resin which is insoluble or scarcely soluble in alkali, but becomes easily soluble in alkali when the acid-dissociable group dissociates (hereinafter referred to as "acid-dissociable group-containing resin (C)").

If 50% or more of the initial film thickness of a resist film remains after development when the resist film made only from the acid-dissociable group-containing resin (C) is developed under the same alkaline development conditions employed for forming a resist pattern using a resist film formed from a radiation-sensitive resin composition comprising the acid-dissociable group-containing resin (C), such a characteristic of the acid-dissociable group-containing resin (C) is referred to as "insoluble or scarcely soluble in alkali" in the present invention.

As examples of the acid-dissociable group-containing resin (C), a resin, insoluble or scarcely soluble in alkali by itself, obtainable from an alkali-soluble resin containing one or more acid functional groups such as a phenolic hydroxyl group or carboxyl group by replacing one or more hydrogen atoms in the acid functional groups with acid-dissociable groups can be given.

As preferable examples of the acid-dissociable group-containing resin (C) in the present invention, a resin having a recurring unit of the following formula (2) (hereinafter referred to as "recurring unit (2)"), a recurring unit of the following formula (3) (hereinafter referred to as "recurring unit (3)"), and/or a recurring unit of the following formula (4) (hereinafter referred to as "recurring unit (4)") can be given.

This resin is hereinafter referred to as "resin (C1)".

In the formula (2), $R^3$ represents a hydrogen atom or a methyl group, $R^4$ represents a monovalent organic group (excluding the group same as —$OR^7$ in the formula (3)), m is an integer of 0-3, and n is an integer of 1-3, provided that two or more $R^4$ groups, if present, may be either the same or different.

In the formula (3), $R^5$ represents a hydrogen atom or a methyl group, $R^6$ represents a monovalent organic group (excluding the group same as —$OR^7$), $R^7$ represents a monovalent acid-dissociable group, p is an integer of 0-3, and q is an integer of 1-3, provided that two or more $R^6$ groups and two or more $R^7$ groups, if present, may be either the same or different.

In the formula (4), $R^8$ represents a hydrogen atom or a methyl group, and $R^9$ represents a t-butyl group.

As examples of the monovalent organic group represented by $R^4$ in the formula (2) and $R^6$ in the formula (3), monovalent linear, branched, or cyclic alkyl groups having 1-12 carbon atoms, monovalent aromatic hydrocarbon groups having 6-20 carbon atoms, monovalent oxygen-containing organic groups, and monovalent nitrogen-containing organic groups can be given.

As examples of the alkyl groups, a methyl group, ethyl group, n-propyl group, i-propyl group, n-butyl group, 2-methylpropyl group, 1-methylpropyl group, t-butyl group, cyclopentyl group, and cyclohexyl group can be given.

As examples of the monovalent aromatic hydrocarbon groups, a phenyl group, o-tolyl group, m-tolyl group, p-tolyl group, 2,4-xylyl group, 2,6-xylyl group, 3,5-xylyl group, mesityl group, o-cumenyl group, m-cumenyl group, p-cumenyl group, benzyl group, phenethyl group, 1-naphthyl group, and 2-naphthyl group can be given.

As examples of the monovalent oxygen-containing organic group, a carboxyl group; linear, branched, or cyclic hydroxyalkyl groups having 1-8 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, 4-hydroxybutyl group, 3-hydroxycyclopentyl group, and 4-hydroxycyclohexyl group; linear, branched, or cyclic alkoxyl groups having 1-8 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group; linear alkoxycarbonyloxy groups having 2-9 carbon atoms such as a methoxycarbonyloxy group, ethoxycarbonyloxy group, n-propoxycarbonyloxy group, and n-butoxycarbonyloxy group; linear, branched, or cyclic (1-alkoxyalkoxy) alkyl groups having 3-10 carbon atoms such as a (1-methoxyethoxy)methyl group, (1-ethoxyethoxy)methyl group, (1-n-propoxyethoxy)methyl group, (1-n-butoxyethoxy)methyl group, (1-cyclopentyloxyethoxy)methyl group, (1-cyclohexyloxyethoxy)methyl group, (1-methoxypropoxy)methyl group, and (1-ethoxypropoxy)methyl group; linear, branched, or cyclic alkoxycarbonyloxyalkyl groups having 3-10 carbon atoms such as a methoxycarbonyloxymethyl group, ethoxycarbonyloxymethyl group, n-propoxycarbonyloxymethyl group, i-propoxycarbonyloxymethyl group, n-butoxycarbonyloxymethyl group, t-butoxycarbonyloxymethyl group, cyclopentyloxycarbonyloxymethyl group, and cyclohexyloxycarbonyloxymethyl group; and the like can be given.

Examples of the monovalent nitrogen-containing organic groups include a cyano group; linear, branched, or cyclic cyanoalkyl groups having 2-9 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, 4-cyanobutyl group, 3-cyanocyclopentyl group, and 4-cyanocyclohexyl group; and the like.

As examples of the monovalent acid-dissociable organic groups represented by $R^7$ in the formula (3), a substituted methyl group, 1-substituted ethyl group, 1-branched alkyl group, triorganosilyl group, triorganogermyl group, alkoxycarbonyl group, acyl group, and monovalent cyclic acid-dissociable group can be given. As examples of the substituted methyl group, a methoxymethyl group, methylthiomethyl group, ethoxymethyl group, ethylthiomethyl group, (2-methoxyethoxy)methyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of the 1-substituted ethyl groups, a 1-methoxyethyl group, 1-methylthioethyl group, 1,1-dimethoxyethyl group, 1-ethoxyethyl group, 1-ethylthioethyl group, 1,1-diethoxyethyl group, 1-ethoxypropyl group, 1-propoxyethyl group, 1-cyclohexyloxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, and 1-t-butoxycarbonylethyl group can be given.

As examples of the 1-branched alkyl group, an i-propyl group, 1-methylpropyl group, t-butyl group, 1,1-dimethylpropyl group, 1-methylbutyl group, and 1,1-dimethylbutyl group can be given.

As examples of the triorganosilyl group, a trimethylsilyl group, ethyldimethylsilyl group, methyldiethylsilyl group, triethylsilyl group, i-propyldimethylsilyl group, methyldi-i-propylsilyl group, tri-1-propylsilyl group, t-butyldimethylsilyl group, methyldi-t-butylsilyl group, tri-t-butylsilyl group, phenyldimethylsilyl group, methyldiphenylsilyl group, and triphenylsilyl group can be given.

As examples of the triorganogermyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of the alkoxycarbonyl group, a methoxycarbonyl group, ethoxycarbonyl group, i-propoxycarbonyl group, and t-butoxycarbonyl group can be given.

As examples of the acyl group, an acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, and mesyl group can be given.

As examples of the monovalent cyclic acid-dissociable group, a cyclopropyl group, cyclopentyl group, cyclohexyl group, cyclohexenyl group, 4-methoxycyclohexyl group, tetrahydrofuranyl group, tetrahydropyranyl group, tetrahydrothiofuranyl group, tetrahydrothiopyranyl group, 3-bromotetrahydropyranyl group, 4-methoxytetrahydropyranyl group, 4-methoxytetrahydrothiopyranyl group, and 3-tetrahydrothiophene-1,1-dioxide group can be given.

Of these monovalent acid-dissociable groups, a t-butyl group, benzyl group, 1-methoxyethyl group, 1-ethoxyethyl group, trimethylsilyl group, t-butoxycarbonyl group, t-butoxycarbonylmethyl group, tetrahydrofuranyl group, tetrahydropyranyl group, tetrahydrothiofuranyl group, tetrahydrothiopyranyl group, and the like are preferable.

As examples of preferable recurring units (2) in the present invention, units obtainable by cleavage of a polymerizable unsaturated bond such as 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3- hydroxystyrene, 5-methyl-3-hydroxystyrene, 2-methyl-4-hydroxystyrene, 3-methyl-4-hydroxystyrene, 3,4-dihydroxystyrene, and 2,4,6-trihydroxystyrene can be given.

The recurring units (2) may be used in the resin (C1) either individually or in combination of two or more.

As examples of preferable recurring units (3) in the present invention, units obtainable by cleavage of a polymerizable unsaturated bond such as 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, and 4-(1-ethoxyethoxy)-α-methylstyrene can be given.

The recurring units (3) may be used in the resin (C1) either individually or in combination of two or more.

The recurring units (4) in the present invention are preferably a t-butyl acrylic acid or t-butyl methacrylic acid.

The recurring units (4) may be used in the resin (C1) either individually or in combination of two or more.

The resin (C1) may comprise recurring units other than the recurring units (2)-(4) (hereinafter referred to as "other recurring units").

The other recurring units include units obtainable by cleavage of a polymerizable unsaturated bond of monomers such as, for example, vinyl aromatic compounds such as styrene, α-methylstyrene, 2-methylstyrene, 3-methylstyrene, 4-methylstyrene, 2-methoxystyrene, 3-methoxystyrene, 4-methoxystyrene, and 4-(2-t-butoxycarbonylethyloxy)styrene; (meth)acrylates such as methyl (meth)acrylate, ethyl (meth)acrylate, n-propyl (meth)acrylate, i-propyl (meth)acrylate, n-butyl (meth)acrylate, 2-methylpropyl (meth)acrylate, 1-methylpropyl (meth)acrylate, n-pentyl (meth)acrylate, neopentyl (meth)acrylate, n-hexyl (meth)acrylate, 2-ethylhexyl (meth)acrylate, 2-hydroxyethyl (meth)acrylate, 2-hydroxypropyl (meth)acrylate, 3-hydroxypropyl (meth)acrylate, phenyl (meth)acrylate, benzyl (meth)acrylate, 1-methylcyclopentyl (meth)acrylate, 1-ethylcyclopentyl (meth)acrylate, 1-methyladamantyl (meth)acrylate, 1-ethyladamantyl (meth)acrylate, 8-methyl-8-tricyclodecyl (meth)acrylate, 8-ethyl-8-tricyclodecyl (meth)acrylate, 3-methyl-3-tetracyclododecenyl (meth)acrylate, 3-ethyl-3-tetracyclododecenyl (meth)acrylate, and 2,5-dimethylhexane-2,5-di(meth)acrylate; unsaturated carboxylic acids and anhydrides thereof such as (meth)acrylic acid, crotonic acid, maleic acid, maleic anhydride, fumaric acid, and cinnamic acid; carboxylalkyl esters of unsaturated carboxylic acids such as 2-carboxyethyl (meth)acrylate, 2-carboxypropyl (meth)acrylate, and 3-carboxypropyl (meth)acrylate; unsaturated nitryl compounds such as (meth)acrylonitrile, α-chloroacrylonitrile, crotonitrile, maleinitrile, and fumaronitrile; unsaturated amide compounds such as (meth)acrylamide, N,N-dimethyl(meth)acrylamide, crotonamide, maleinamide, and fumaramide; unsaturated imide compounds such as maleimide, N-phenylmaleimide, and N-cyclohexylmaleimide; and other nitrogen-containing vinyl compounds such as N-vinyl-β-caprolactam, N-vinylpyrrolidone, 2-vinylpyridine, 3-vinylpyridine, 4-vinylpyridine, 2-vinylimidazole, and 4-vinylimidazole.

In the resin (C1), these other recurring units may be present either individually or in combination of two or more.

As particularly preferable examples of the resin (C1) of the present invention, 4-hydroxystyrene/4-t-butoxystyrene copolymer, 4-hydroxystyrene/t-butyl (meth)acrylate copolymer, 4-hydroxystyrene/4-t-butoxystyrene/styrene copolymer, 4-hydroxystyrene/t-butyl (meth)acrylate/styrene copolymer, 4-hydroxystyrene/4-t-butoxystyrene/2,5-dimethylhexane-2,5-di(meth)acrylate copolymer, 4-hydroxystyrene/t-butyl (meth)acrylate/2,5-dimethylhexane-2,5-di(meth)acrylate copolymer, 4-hydroxystyrene/t-butyl (meth)acrylate/2,5-dimethylhexane-2,5-di(meth)acrylate/styrene copolymer, and the like can be given.

In the resin (C1), the amount of the recurring unit (2) is preferably 60-80 mol %, and more preferably 65-75 mol %, the amount of the recurring unit (3) and/or recurring unit (4) is preferably 10-40 mol %, and more preferably 10-35 mol %, and the amount of the other recurring units is usually 25 mol % or less, and preferably 10 mol % or less. If the amount of the recurring unit (2) is less than the above range, adhesiveness of resist patterns to substrates tends to decrease, and if the amount exceeds the above range, contrast after development tends to decrease. If the amount of the recurring unit (3) and/or recurring unit (4) is less than the above range, resolution tends to decrease, and if the amount exceeds the above range, adhesiveness to the resist pattern substrate tends to decrease. If the amount of the other recurring units exceeds the above range, adhesiveness to the resist pattern substrate and resolution tend to decrease.

The amount of the acid-dissociable groups introduced into the acid-dissociable group-containing resin (C) (the amount of the number of the acid-dissociable groups in the total number of non-protected acid functional groups and acid-dissociable groups in the acid-dissociable group-containing resin (C)) is preferably 10-100%, and still more preferably 15-100%, although the amount varies depending on the types of acid-dissociable groups and the alkali-soluble resin into which the acid-dissociable groups are introduced.

The polystyrene-reduced weight average molecular weight (hereinafter referred to as "Mw") of the acid-dissociable group-containing resin (C) determined by gel permeation chromatography (GPC) is preferably 1,000-150,000, and more preferably 3,000-100,000.

The ratio of Mw to the polystyrene-reduced number average molecular weight (hereinafter referred to as "Mn") determined by gel permeation chromatography (Mw/Mn) of the acid-dissociable group-containing resin (C) is usually 1-10, and preferably 1-5.

In the present invention, the acid-dissociable group-containing resin (C) may be used either individually or in combination of two or more.

Additives

The positive-tone radiation-sensitive resin composition of the present invention may comprise a compound of the following formula (5) (hereinafter referred to as "additive (E)"),

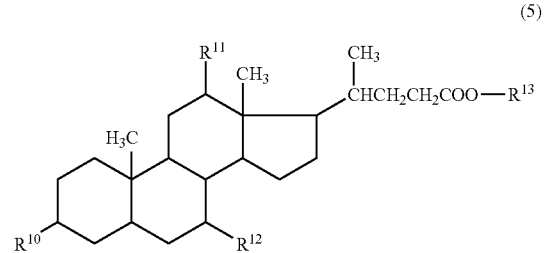

(5)

wherein $R^{10}$, $R^{11}$, and $R^{12}$ individually represent a hydrogen atom, hydroxyl group, or monovalent organic group, with at least one of $R^{10}$, $R^{11}$, and $R^{12}$ being a hydroxyl group, and $R^{13}$ represents a monovalent acid-dissociable group or a monovalent organic group possessing an acid-dissociable moiety in the structure.

The additive (E) exhibits excellent mutual solubility with other components used in the positive-tone radiation-sensitive resin composition of the present invention due to possession of a hydrophobic steroid skeleton and moderate polar groups such as an alcoholic hydroxyl group and ester group. In addition, the compound exhibits a large dissolution contrast and can suppress partial insolublization during overexposure due to a large polarity change before and after dissociation of the acid-dissociable group. Furthermore, because the compound possesses a large alicyclic structure, resist coatings obtained from the resin not only exhibit high transmittance to short wave radiations, particularly to a KrF excimer laser, ArF excimer laser, and F2 excimer laser, but also exhibit improved dry etching resistance.

The following groups are given as examples of the monovalent organic group represented by $R^{10}$, $R^{11}$, or $R^{12}$ in the formula (5): linear or branched alkyl groups having 1-12 carbon atoms such as a methyl group, ethyl group, n-propyl group, i-propyl group, n-butyl group, 2-methylpropyl group, 1-methylpropyl group, and t-butyl group; linear or branched alkoxyl groups having 1-12 carbon atoms such as a methoxy group, ethoxy group, n-propoxy group, i-propoxy group, n-butoxy group, 2-methylpropoxy group, 1-methylpropoxy group, and t-butoxygroup; linear or branched alkoxycarbonyl groups having 2-13 carbon atoms such as a methoxycarbonyl group, ethoxycarbonyl group, n-propoxycarbonyl group, i-propoxycarbonyl group, n-butoxycarbonyl group, and t-butoxycarbonyl group; linear or branched alkoxyalkoxyl group having 2-13 carbon atoms such as a methoxymethoxy group, ethoxymethoxy group, 1-methoxyethoxy group, 1-ethoxyethoxy group, 2-methoxyethoxy group, and 2-ethoxyethoxy group; and the like can be given.

Preferable groups for $R^{10}$, $R^{11}$, and $R^{12}$ in the formula (5) are a hydrogen atom, hydroxyl group, methyl group, ethyl group, methoxy group, and t-butoxy group, and the like.

As examples of the monovalent acid-dissociable group represented by $R^3$, the same groups as mentioned above for the monovalent acid-dissociable group for $R^7$ in formula (3), such as a substituted methyl group, 1-substituted ethyl group, 1-branched alkyl group, triorganosilyl group, triorganogermyl group, alkoxycarbonyl group, acyl group, and cyclic acid-dissociable group can be given.

Of these monovalent acid-dissociable groups, a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, 2-methyl-2-adamantyl group, and the like are preferable.

As the monovalent organic group having an acid-dissociable moiety in the structure represented by $R^3$, organic groups of the following formula (6) are preferable,

—$CH_2COO$—$R^{14}$ (6)

wherein $R^{14}$ represents a monovalent acid-dissociable group.

As examples of the monovalent acid-dissociable group represented by $R^{14}$, the same groups as mentioned above for the monovalent acid-dissociable group for $R^7$ in formula (3), such as a substituted methyl group, 1-substituted ethyl group, 1-branched alkyl group, triorganosilyl group, triorganogermyl group, alkoxycarbonyl group, acyl group, and cyclic acid-dissociable group can be given.

Of these monovalent acid-dissociable groups, a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, 2-methyl-2-adamantyl group, and the like are preferable.

In the present invention, the additive (E) may be used either individually or in combination of two or more.

The amount of the additive (E) to be added is 20 parts by weight or less, and preferably 10 parts by weight or less, for 100 parts by weight of the acid-dissociable group-containing resin (C). If the amount of the additive (E) exceeds the above range, adhesiveness to the resist pattern substrate tends to decrease.

The additive (E) is synthesized by esterification of a corresponding steroid-type carboxylic acid such as a cholic acid, deoxycholic acid, or lithocholic acid in the presence of an acid catalyst or basic catalyst. The following esterification reactions can be applied. The esterification in the presence of an acid catalyst can be carried out by, for example, dissolving the corresponding steroid-type carboxylic acid and acid catalyst in a solvent, adding a corresponding olefin such as an isobutene, and causing the mixture to react.

As the acid catalyst, p-toluenesulfonic acid, methanesulfonic acid, concentrated sulfuric acid, phosphoric acid, and the like can be given. These acid catalysts may be used either individually or in combination of two or more.

The esterification in the presence of a basic catalyst can be carried out by, for example, dissolving the corresponding steroid-type carboxylic acid and a basic catalyst in a solvent, adding a bromoacetate such as t-butyl bromoacetate, and causing the mixture to react.

As the basic catalyst, a super-strong basic catalyst such as sodium amide, sodium hydride, n-butyl lithium, and 1,8-diazabicyclo[5.4.0]undec-7-ene; a strong basic catalyst such as methoxy potassium, ethoxy potassium, and t-butoxy potassium; a weak basic catalyst such as triethylamine, tri-n-butyl amine, and potassium carbonate; and the like can be given. These basic catalysts may be used either individually or in combination of two or more.

As examples of the solvent used in the esterification in the presence of an acid catalyst or basic catalyst, dimethylformamide, dimethylacetamide, dimethylsulfoxide, t-butanol, acetone, acetonitrile, tetrahydrofuran, chloroform, and methylene chloride can be given. These solvents may be used either individually or in combination of two or more.

The esterification in the presence of an acid catalyst or basic catalyst are carried out at a temperature of usually −20° C. to 150° C., and preferably 0 to 70° C., for usually 1 minute to 96 hours, and preferably 30 minutes to 48 hours.

It is preferable to add an acid diffusion controller to the positive-tone radiation-sensitive resin composition of the present invention. The acid diffusion controller controls diffusion of an acid generated from the acid generator (B) upon exposure in the resist film to hinder unfavorable chemical reactions in the unexposed area.

Use of such an acid diffusion controller improves the preservation stability of the composition and resolution as a resist. Moreover, line width change of the resist pattern due to fluctuation of PED can be controlled, whereby remarkably superior process stability can be achieved.

As the acid diffusion controller, an organic compound containing nitrogen of which the basicity does not change during exposure or heating for forming a resist pattern is preferable.

As examples of such nitrogen-containing organic compounds, a compound shown by the following formula (11) (hereinafter called "nitrogen-containing compound (i)"),

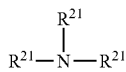

(11)

wherein $R^{21}$ individually represents a hydrogen atom, alkyl group, aryl group, or aralkyl group which may be substituted or unsubstituted, a diamino compound having two nitrogen atoms in the molecule (hereinafter referred to as "nitrogen-containing compound (ii)"), a diamino polymer having three or more nitrogen atoms in the molecule (hereinafter referred to as "nitrogen-containing compound (iii)"), an amide group-containing compound, urea compound, nitrogen-containing heterocyclic compound, N,N-dimethylacrylamide (co)polymer, and the like can be given.

As examples of the nitrogen-containing compounds (i), linear, branched, or cyclic monoalkylamines such as n-hexylamine, n-heptylamine, n-octylamine, n-nonylamine, n-decylamine, and cyclohexylamine; linear, branched, or cyclic dialkylamines such as di-n-butylamine, di-n-pentylamine, di-n-hexylamine, di-n-heptylamine, di-n-octylamine, di-n-nonylamine, di-n-decylamine, methylcyclohexylamine, and dicyclohexylamine; linear, branched, or cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; linear, branched, or cyclic alkanol amines such as an ethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine can be given.

Examples of the nitrogen-containing compounds (ii) include ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

Examples of the nitrogen-containing compounds (iii) include polyethyleneimine, polyallylamine, and a (co)polymer of N-(2-dimethylaminoethyl)acrylamide.

Examples of the compounds containing an amide group include formamide, N-methylformamide, N,N-dimethylformamide, acetamide, N-methylacetamide, N,N-dimethylacetamide, propionamide, benzamide, pyrrolidone, and N-methylpyrrolidone.

Examples of the urea compounds include urea, methylurea, 1,1-dimethylurea, 1,3-dimethylurea, 1,1,3,3-tetramethylurea, 1,3-diphenylurea, and tributylthiourea.

Examples of the nitrogen-containing heterocyclic compounds include imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane.

As examples of the (co)polymer of N,N-dimethylacrylamide, a 4-hydroxystyrene/4-t-butoxystyrene/N,N-dimethylacrylamide copolymer, 4-hydroxystyrene/4-t-butoxystyrene/styrene/N,N-dimethylacrylamide copolymer, and the like.

Base precursors possessing an acid-dissociable group, such as N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxy carbonyl) diethanolamine, N-(t-butoxycarbonyl)dicyclohexylamine, and N-(t-butoxycarbonyl)diphenylamine can be used as nitrogen-containing organic compounds acting as an acid diffusion controller.

Of these nitrogen-containing organic compounds, the nitrogen-containing compound (i), nitrogen-containing heterocyclic compound, N,N-dimethylacrylamide (co)polymer, and base precursors having an acid-dissociable group are preferable.

The acid diffusion controllers may be used either individually or in combination of two or more.

The amount of the acid diffusion controller to be added is usually 15 parts by weight or less, preferably 0.001-10 parts by weight, and still more preferably 0.005-5 parts by weight for 100 parts by weight of the acid-dissociable group-containing resin (C). If the amount of the acid diffusion controller exceeds the determined range, sensitivity as a resist and developability of the exposed area tend to decrease. If the proportion is less than 0.001 part by weight, accuracy of pattern profiles and dimensions as a resist may decrease depending on processing conditions.

Surfactants exhibiting an action of improving the applicability or striation of the composition and developability as a resist may be added to the positive-tone radiation-sensitive resin composition of the present invention.

Examples of such surfactants include polyoxyethylene lauryl ether, polyoxyethylene stearyl ether, polyoxyethylene oleyl ether, polyoxyethylene n-octyl phenol ether, polyoxyethylene n-nonyl phenol ether, polyethylene glycol dilaurate, polyethylene glycol distearate; and commercially available products such as FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and Polyflow No. 75, No. 95 (manufactured by Kyoeisha Chemical Co., Ltd.).

These surfactants may be used either individually or in combination of two or more.

The amount of the surfactants to be added is usually 2 parts by weight or less for 100 parts by weight of the acid-dissociable group-containing resin (C).

In addition to the anthracene derivative (A) and other dyes, the positive-tone radiation-sensitive resin composition of the present invention may comprise one or more types of Rose Bengal, for example.

The amount of the Rose Bengal to be added is usually 50 parts by weight or less for 100 parts by weight of the acid-dissociable group-containing resin (C).

In addition, other dyes and/or pigments may be added to visualize latent images of exposed areas and to reduce the effect of halation during exposure. An adhesion adjuvant may be added to improve adhesion to the substrate.

Halation inhibitors such as 4-hydroxy-4'-methylchalcone, form improvers, preservation stabilizers, antifoaming agents, and the like can also be added.

Composition Solution

When used, the positive-tone radiation-sensitive resin composition of the present invention is usually prepared into a composition solution by homogeneously dissolving the composition in a solvent so that the total solid concentration is 0.1-50 wt %, and preferably 1-40 wt %, and filtering the solution using a filter with a pore diameter of about 0.2 μm.

As examples of solvents used for preparation of the composition solution, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; lactic acid esters such as methyl lactate, ethyl lactate, n-propyl lactate, and i-propyl lactate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methylpyruvate, and ethyl pyruvate; aromatic hydrocarbons such as toluene and xylene; ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; lactones such as γ-butyrolactone, and the like can be given.

These solvents may be used either individually or in combination of two or more.

Formation of Resist Pattern

A resist pattern is formed from the positive-tone radiation-sensitive resin composition of the present invention by applying the composition solution prepared as mentioned above to substrates such as a silicon wafer or a wafer covered with aluminum using an appropriate application method such as rotational coating, cast coating, and roll coating to form a resist film. The resist film is then optionally heated at a temperature of about 70-160° C. (hereinafter referred to as "PB") and exposed to light through a predetermined mask pattern.

As preferable examples of the radiation used for exposure, deep ultraviolet rays such as a KrF excimer laser (wavelength 248 nm), ArF excimer laser (wavelength 193 nm), and F2 excimer laser (wavelength 157 nm) can be given.

The exposure conditions such as exposure amount are appropriately determined depending on the composition of the positive-tone radiation-sensitive resin composition, types of additives, and the like.

In the present invention, it is preferable to perform post-exposure bake (hereinafter referred to as "PEB") at 70-160° C. for 30 seconds or more in order to steadily form a minute resist pattern with high precision. If the heating temperature for PEB is less than 70° C., sensitivity may fluctuate according to the type of substrate.

A desired resist pattern is obtained by developing the resist using an alkaline developer at 10-50° C. for 10-200 seconds, preferably at 15-30° C. for 15-100 seconds, and still more preferably at 20-25° C. for 15-90 seconds.

As the alkaline developer, an alkaline aqueous solution prepared by dissolving an alkali compound such as an alkali metal hydroxide, aqueous ammonia, mono-, di-, or tri-alkylamine, mono-, di-, or tri-alkanolamine, heterocyclic amine, tetraalkylammonium hydroxide, choline, 1,8-diazabicyclo[5.4.0]-7-undecene, or 1,5-diazabicyclo[4.3.0]-5-nonene to a concentration of 1-10 wt %, preferably 1-5 wt %, and particularly preferably 1-3 wt % can be used.

Moreover, an appropriate amount of a water-soluble organic solvent such as methanol and ethanol or surfactants can be added to the above alkaline aqueous solution.

When forming a resist pattern, a protective film may be provided on the resist film in order to prevent an adverse effect of basic impurities and the like which are present in the environmental atmosphere.

The positive-tone radiation-sensitive resin composition of the present invention contains the anthracene derivative (A) with low sublimation properties and excellent compatibility with other components, exhibits optimum controllability of radiation transmittance as a chemically amplified positive-tone resist effectively responding to active radiation, particularly to deep ultraviolet rays represented by a KrF excimer laser (wavelength 248 nm), ArF excimer laser (wavelength 193 nm), and F2 excimer laser (wavelength 157 nm), effectively controls line width variation in resist patterns due to fluctuation in the resist film thickness on a highly refractive substrate, and exhibits good sensitivity and resolution and excellent focal depth allowance.

By controlling the metal impurity content in the anthracene derivative (A) of the positive-tone radiation-sensitive resin composition of the present invention, contamination of the photolithography machine and the obtained semiconductor chip during formation of resist patterns can be controlled thereby maintaining yield and product quality.

Therefore, the positive-tone radiation-sensitive resin composition of the present invention is extremely suitable in the field of microfabrication represented by manufacturing of semiconductor devices, which will become more and more minute.

EXAMPLES

The present invention will be described in more detail by way of examples. However, these examples should not be construed as limiting the present invention.

Synthesis of Other Dyes

Synthesis Example 1

After dissolving 100 g of anthracene-9-carboxylic acid and 55 g of t-butoxy potassium in 500 g of dimethylformamide, 100 g of t-butyl bromoacetate was added and the mixture was reacted for two hours at 23° C. 200 g of ethyl acetate and 200 g of water were added to the reaction mixture to separate into two layers. After discharging the water layer, the organic layer was washed with water and the solvent was evaporated to obtain 112 g of t-butoxy carbonyl methyl anthracene-9-carboxylate as a yellow solid. This compound is indicated as "other dye (D-1)".

Synthesis Example 2

100 g of carbazole, 117 g of t-butyl bromoacetate, and 67 g of t-butoxy potassium were dissolved in 1,000 g of dimethylformamide. The mixture was reacted overnight at room temperature. After the addition of 300 g of 5 wt % oxalic acid aqueous solution, the reaction mixture was extracted with 2,000 g of n-hexane. Precipitate obtained by crystallization in a mixed solvent of 500 g of dimethylformamide and 500 g of n-hexane was dried under vacuum to obtain 79 g of N-(t-butoxycarbonylmethyl)carbazole as a white solid. This compound is indicated as "other dye (D-2)".

Synthesis Example 3

81 g of t-butoxy potassium was mixed with a solution of 100 g of carbazole in 500 g of dimethylformamide. 110 g of methyl bromoacetate was gradually dropped to the mixture at room temperature, followed by reaction for four hours at room temperature. Then, 106 g of 35 wt % sodium hydroxide aqueous solution was added dropwise to the reaction solution and the resulting mixture was stirred for two hours at room temperature. Next, 1,000 g of ethyl acetate and 1,000 g of distilled water were added to the reaction solution to separate the solution into two layers. The organic layer was discarded. 1,000 g of 2 N hydrochloric acid was added to the water layer and the mixture was stirred for one hour at room temperature. 1,000 g of ethyl acetate was added to separate the solution into two layers. The water layer was discarded. The organic layer was neutralized with the addition of 0.5 wt % sodium hydrogencarbonate aqueous solution and washed with distilled water. After condensing the organic layer, a small amount of ethyl acetate was added to recrystallize the product, thereby obtaining 65 g of 9-carbazoyl acetate as a pale yellow solid. This compound is indicated as "other dye (D-3)".

Synthesis of Additive (E)

Synthesis Example 4

After dissolving 50 g of potassium carbonate in 500 g of water, 100 g of lithocholic acid was slowly added, followed by the addition of 500 g of tetrahydrofuran and 60 g of t-butyl bromoacetate. The mixture was then reacted for 7 hours at 60° C. Then, 200 g of ethyl acetate and 200 g of water were added to the reaction mixture to separate into two layers. The water layer was discarded and the organic layer was washed with water. n-Hexane was added to the organic layer to recrystallize the reaction product. The crystals were dried under vacuum to obtain 56 g of a white solid of the compound shown by the following formula. This compound is indicated as "additive (E-1)".

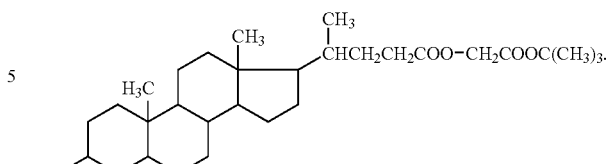

Synthesis of Acid-Dissociable Group-Containing Resin (C)

Synthesis Example 5

140 g of 4-acetoxystyrene, 50 g of 4-t-butoxystyrene, 9 g of 2,5-dimethylhexane-2,5-diacrylate, 8 g of azobisisobutyronitrile, and 6 g of t-dodecylmercaptan were dissolved in 240 g of propylene glycol monomethyl ether. The mixture was polymerized for 16 hours at 70° C. in a nitrogen atmosphere. After the polymerization, the reaction solution was added dropwise to 2,000 g of n-hexane to coagulate and purify the resulting resin, which was dried under reduced pressure for three hours at 50° C.

190 g of this purified resin was again dissolved in 150 g of propylene glycol monomethyl ether. 300 g of methanol, 100 g of triethylamine, and 15 g of water were added and the mixture was hydrolyzed for 8 hours while refluxing at the boiling point. After the reaction, the solvent and triethylamine were evaporated under reduced pressure. The resulting resin was dissolved in acetone to adjust the solid content to 20 wt %. The solution was added dropwise to 2,000 g of water to coagulate the resin. The resulting white powder was filtered and dried overnight at 50° C. under reduced pressure. The resin was found to have Mw and Mw/Mn of 40,000 and 2.6, respectively. The result of $^{13}$C-NMR analysis confirmed that the resin was a copolymer of 4-hydroxystyrene, 4-t-butoxystyrene, and 2,5-dimethylhexane-2,5-diacrylate at a copolymerization molar ratio of 67:30:3. This resin is referred to as "acid-dissociable group-containing resin (C-1)".

Mw and Mn of the acid-dissociable group-containing resin (C-1) and acid-dissociable group-containing resins (C) prepared in the following Synthesis Examples were measured by gel permeation chromatography (GPC) using GPC columns (manufactured by Tosoh Corp., G2000H$_{XZ}$×2, G3000H$_{XZ}$×1, G4000H$_{XZ}$×1) under the following conditions. Flow rate: 1.0 ml/minute, eluate: tetrahydrofuran, column temperature: 40° C., standard reference material: monodispersed polystyrene.

Synthesis Example 6

100 g of 4-acetoxystyrene, 25 g of t-butyl acrylate, 18 g of styrene, 6 g of azobisisobutyronitrile, and 1 g of t-dodecylmercaptan were dissolved in 230 g of propylene glycol monomethyl ether. The mixture was polymerized for 16 hours while maintaining the reaction temperature at 70° C. in a nitrogen atmosphere. After the polymerization, the reaction solution was added dropwise to 2,000 g of n-hexane to coagulate and purify the resulting resin, which was dried under reduced pressure for three hours at 50° C.

135 g of this purified resin was again dissolved in 150 g of propylene glycol monomethyl ether. 300 g of methanol, 80 g of triethylamine, and 15 g of water were added and the mixture was hydrolyzed for 8 hours while refluxing at the boiling point. After the reaction, the solvent and triethylamine were evaporated under reduced pressure. The resulting resin was dissolved in acetone to adjust the solid content to 20 wt %. The solution was added dropwise to 2,000 g of water to coagulate the resin. The resulting white powder was filtered and dried overnight at 50° C. under reduced pressure.

The resin was found to have Mw and Mw/Mn of 11,500 and 1.6 respectively. The result of $^{13}$C-NMR analysis confirmed that the resin was a copolymer of 4-hydroxystyrene, t-butyl acrylate, and styrene at a copolymerization molar ratio of 61:19:20. This resin is referred to as "acid-dissociable group-containing resin (C-2)".

Synthesis Example 7

154 g of 4-acetoxystyrene, 7 g of styrene, 53 g of 4-t-butoxystyrene, 9 g of azobisisobutylonitrile, and 1.3 g of t-dodecylmercaptan were dissolved in 260 g of propylene glycol monomethyl ether. The mixture was polymerized for 16 hours at 70° C. in a nitrogen atmosphere. After the polymerization, the reaction solution was added dropwise to 2,000 g of n-hexane to coagulate and purify the resulting resin, which was dried under reduced pressure for three hours at 50° C.

215 g of this purified resin was again dissolved in 260 g of propylene glycol monomethyl ether. 300 g of methanol, 80 g of triethylamine, and 15 g of water were added and the mixture was hydrolyzed for 8 hours while refluxing at the boiling point. After the reaction, the solvent and triethylamine were evaporated under reduced pressure. The resulting resin was dissolved in acetone to adjust the solid content to 20 wt %. The solution was added dropwise to 2,000 g of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the resin was a copolymer of 4-hydroxystyrene, styrene, and 4-t-butoxystyrene at a copolymerization molar ratio of 72:5:23. This resin is referred to as "acid-dissociable group-containing resin (C-3)".

Examples 1-8 and Comparative Example 1

Components shown in Table 1 (part(s) indicate part(s) by weight) were mixed to prepare homogeneous solutions. The solutions were filtered through a membrane filter with a pore diameter of 200 nm to prepare solution compositions.

In a clean track ("ACT-8" manufactured by Tokyo Electron, Ltd.), the composition solutions were spin-coated on a silicon wafer and pre-baked under the conditions shown in Table 2 to form resist films with a thickness of 600 nm.

The resist films were exposed to light through a binary mask using a scanner ("NSR-S203B" manufactured by Nikon Corp., numerical aperture=0.68, σ=0.75) and baked (PEB) under the conditions shown in Table 2. The resist patterns, obtained by developing the resist at 23° C. for 30 seconds by a paddle method using an LD nozzle and a 2.38 wt % tetramethylammonium hydroxide aqueous solution, followed by washing with purified water and drying, were evaluated as follows.

The evaluation results are shown in Table 3.

Sensitivity:

Sensitivity was evaluated based on an optimum exposure dose which is a dose capable of forming a 1:1 line and space pattern (1L1S) with a line width of 220 nm, when a resist coating formed on a silicon wafer is exposed to light, immediately followed by PEB, development, washing with water, drying, and forming resist patterns.

Resolution:

The minimum line width of the line and space (1L1S) pattern resolved by an optimum dose of radiation was taken as the resolution.

Depth of Field (DOF):

A resist pattern was formed at an optimum dose by changing the focal depth from −1.0 μm to +1.0 μm at an interval of 0.1 μm. The focal depth range in which the resist pattern line width is in the range of 198-242 nm was taken as the depth of field (DOF).

Line Width Fluctuation Value:

The line width of line-and-space patterns (1L1S) formed at an optimum exposure dose of resist films with a thickness of (600−40) nm, (600−30) nm, (600−20) nm, (600−10) nm, 600 nm, (600+10) nm, (600+20) nm, (600+30) nm, or (600+40) nm were measured using a scanning electron microscope S-9220, Hitachi high resolution FEB length measuring apparatus for semiconductors to determine the line width fluctuation value by subtracting the minimum line width from the maximum line width.

The components in Table 1 other than those described above are as follows.

Anthracene Derivative (A)

A1-1: Anthracene-9-carboxylic acid (commercially available product)

A1-2: Anthracene-9,10-dicarboxylic acid (commercially available product)

Acid Generator (B)

B-1: diphenyliodonium 10-camphorsulfonate
B-2: diphenyliodonium trifluoromethanesulfonate
B-3: bis(p-fluorophenyl)iodonium 10-camphorsulfonate
B-4: N-(trifluoromethanesulfonyloxy)bicyclo[2.2.1]hept-5-ene-2,3-dicarboximide
B-5: triphenylsulfonium trifluoromethanesulfonate
B-6: N-[(5-methyl-5-carboxymethylbicyclo[2.2.1]heptan-2-yl)sulfonyloxy] succinimide, Additive (Acid Diffusion Controller)

F-1: 2-phenylpyridine
F-2: N-(t-butoxycarbonyl)-2-phenylbenzimidazole

Solvent

S-1: ethyl lactate
S-2: ethyl 3-ethoxypropionate
S-3: propylene glycol monomethyl ether acetate

TABLE 1

| | Anthracene derivative (A) or other dye (part by weight) | Acid generator (B) (part by weight) | Acid-dissociable group-containing resin (C) (part by weight) | Additive (part by weight) | Solvent (part by weight) |
|---|---|---|---|---|---|
| Example 1 | A1-1 (1) | B-4 (9) | C-1 (100) | F-2 (0.1) | S-1 (560) S-3 (240) |
| Example 2 | A1-1 (1) | B-4 (9) B-1 (1) | C-2 (100) | F-2 (0.1) | S-1 (560) S-2 (240) |
| Example 3 | A1-1 (1) | B-4 (9) B-6 (1) | C-3 (100) | F-2 (0.07) | S-1 (560) S-3 (240) |
| Example 4 | A1-2 (1) | B-4 (9) B-3 (1) | C-3 (100) | F-1 (0.1) | S-1 (560) S-3 (240) |
| Example 5 | A1-1 (0.5) D-1 (0.5) | B-4 (9) B-2 (0.5) | C-3 (100) | F-2 (0.1) | S-1 (560) S-3 (240) |
| Example 6 | A1-1 (0.5) D-2 (0.5) | B-4 (9) B-5 (0.5) | C-3 (100) | F-2 (0.15) | S-1 (560) S-3 (240) |
| Example 7 | A1-1 (1.0) | B-4 (9) | C-3 (100) | E-1 (1.0) F-2 (0.1) | S-1 (560) S-3 (240) |
| Example 8 | A1-1 (0.5) D-3 (0.5) | B-4 (9) B-5 (0.3) | C-3 (100) | F-2 (0.1) | S-1 (560) S-3 (240) |
| Comparative Example 1 | — | B-4 (9) | C-3 (100) | F-2 (0.1) | S-1 (560) S-3 (240) |

TABLE 2

| | PB | | PEB | |
|---|---|---|---|---|
| | Temperature (° C.) | Time (Sec.) | Temperature (° C.) | Time (Sec.) |
| Example 1 | 130 | 90 | 130 | 90 |
| Example 2 | 130 | 90 | 140 | 90 |
| Example 3 | 130 | 90 | 120 | 90 |
| Example 4 | 130 | 90 | 130 | 90 |
| Example 5 | 130 | 90 | 130 | 90 |
| Example 6 | 130 | 90 | 130 | 90 |
| Example 7 | 130 | 90 | 130 | 90 |
| Example 8 | 130 | 90 | 130 | 90 |
| Comparative Example 1 | 130 | 90 | 120 | 90 |

TABLE 3

| | Sensitivity (J/m$^2$) | Resolution (μm) | DOF (μm) | Line width fluctuation value (nm) |
|---|---|---|---|---|
| Example 1 | 350 | 0.20 | 0.5 | 90 |
| Example 2 | 350 | 0.20 | 0.4 | 105 |
| Example 3 | 330 | 0.19 | 0.5 | 85 |
| Example 4 | 340 | 0.20 | 0.4 | 95 |
| Example 5 | 350 | 0.20 | 0.5 | 95 |
| Example 6 | 420 | 0.20 | 0.4 | 90 |
| Example 7 | 340 | 0.19 | 0.6 | 95 |
| Example 8 | 340 | 0.19 | 0.5 | 90 |
| Comparative Example 1 | 360 | 0.21 | 0.2 | 120 |

Purification of Anthracene Derivative (a)

Preparation Example 1

1,000 g of 3 wt % oxalic acid aqueous solution was added to a solution of 30 g of commercially-available anthracene-9-carboxylic acid in 1,000 g of 2-heptanone. The mixture was stirred for 20 minutes at 25° C. and separated into two layers. 1,000 g of 3 wt % oxalic acid aqueous solution was added to the resulting organic layer, followed by stirring the mixture for 20 minutes at 25° C. A washing step of adding 1,000 g of ion-exchanged water to the organic layer and stirring the mixture for 20 minutes at 25° C. was repeated five times. 2-Hepatanone was evaporated under vacuum from the finally-obtained organic layer to obtain 30 g of purified anthracene-9-carboxylic acid, which is indicated as "anthracene derivative (A2-1)".

Preparation Example 2

30 g of commercially available anthracene-9-carboxylic acid was dissolved in 200 g of acetone and the solution was added dropwise to 500 g of 3 wt % oxalic acid aqueous solution while stirring. The resulting precipitate was collected by filtration. The precipitate was washed with 2,000 g of ion-exchanged water and dried under vacuum to obtain 30 g of purified anthracene-9-carboxylic acid. This anthracene is indicated as "anthracene derivative (A2-2)".

Synthesis Example 8

65 g of 4-acetoxystyrene, 3.4 g of styrene, 26 g of 4-t-butoxystyrene, 6.4 g of N,N-dimethylacrylamide, 4.1 g of azobisisobutylonitrile (AIBN), and 0.6 g of t-dodecylmercaptan were dissolved in 100 g of propylene glycol monomethyl ether. The mixture was polymerized for 16 hours at 70° C. in a nitrogen atmosphere. After the polymerization, the reaction solution was added dropwise to 2,000 g of n-hexane to coagulate and purify the resulting resin, which was dried under reduced pressure for three hours at 50° C.

90 g of this purified resin was again dissolved in 100 g of propylene glycol monomethyl ether. 200 g of methanol, 80 g of triethylamine, and 15 g of water were added and the mixture was hydrolyzed for 8 hours while refluxing at the boiling point. After the reaction, the solvent and triethylamine were evaporated under reduced pressure. The resulting resin was dissolved in acetone to adjust the solid content to 20 wt %. The solution was added dropwise to 2,000 g of water to coagulate the resin. The resulting white powder was filtered and dried overnight at 50° C. under reduced pressure.

The resin was found to have Mw and Mw/Mn of 15,000 and 1.7 respectively. The result of $^{13}$C-NMR analysis confirmed that the resin was a copolymer of 4-hydroxystyrene, styrene, 4-t-butoxystyrene, and N,N-dimethylacrylamide at a copolymerization molar ratio of 62:5:23:10. The resin is indicated as "Additive (F-3)" (an acid diffusion controller).

Examples 9-11

The metal impurity content and foreign matter content in a solution of the anthracene-9-carboxylic acid obtained in Purification Examples 1-2 and the commercially available anthracene-9-carboxylic acid were measured by the following methods.

The results are shown in Table 4.

Metal Impurity Content

The metal impurity content was measured by the ICP (inductively coupled plasma) mass spectrometry using an ICP mass spectrometer ("ELAN DRCII" manufactured by Perkin Elmer Japan, Ltd.).

Foreign Matter Content in a Solution 1 g of the sample and 10 g of poly (p-hydroxystyrene) were dissolved in 100 g of ethyl lactate. The solution was filtered through a membrane filter with a pore diameter of 450 nm to prepare a solution composition. The content of foreign matters with a diameter of 0.25 μm or larger in the solution was determined using a particle counter ("KL-20A" manufactured by Rion Co., Ltd.) at a flow rate of 10 ml/min.

TABLE 4

|  | Photo-sensitizer | Metal impurity content (ppb) | | | Foreign matter in solution (parts) |
| --- | --- | --- | --- | --- | --- |
|  |  | $Na^+$ | $K^+$ | $Fe^{3+}$ |  |
| Example 9 | A2-1 | 50 | 100 | 50 | 6 |
| Example 10 | A2-1 | 100 | 50 | 50 | 10 |
| Example 11 | A1-1 | 6000 | 8000 | 1000 | 1400 |

Examples 12-14

Components shown in Table 5 (part(s) indicate part(s) by weight) were mixed to prepare homogeneous solutions. The solutions were filtered through a membrane filter with a pore diameter of 200 nm to prepare solution compositions.

In a clean track ("ACT-8" manufactured by Tokyo Electron, Ltd.), the composition solutions were spin-coated on a silicon wafer and pre-baked at 130° C. for 90 seconds to form resist films with a thickness of 134 nm.

The resist films were exposed to light through a binary mask using a scanner ("NSR-S203B" manufactured by Nikon Corp., numerical aperture=0.68, σ=0.75) and baked (PEB) at 120° C. for 90 seconds. The resist patterns, obtained by developing the resist at 23° C. for 60 seconds by a paddle method using an LD nozzle and a 2.38 wt % tetramethylammonium hydroxide aqueous solution, followed by washing with purified water and drying, were evaluated as follows.

The evaluation results are shown in Table 6.

Sensitivity:

Sensitivity was evaluated based on an optimum exposure dose which is a dose capable of forming a 1:1 line and space pattern (1L1S) with a line width of 240 nm, when a resist coating formed on a silicon wafer is exposed to light, immediately followed by PEB, development, washing with water, drying, and forming resist patterns.

Film Thickness Decrease in Unexposed Areas

A resist film with a thickness of 134 nm was developed immediately after forming without exposure and PEB. The film thickness decrease in unexposed areas was determined.

Exposure Allowance

The exposure allowance was evaluated by the proportion (%) of the radiation exposure dose capable of forming a line and space pattern (1L1S) with a line width of 216-264 nm to the optimum radiation exposure dose.

Depth of Field (DOF):

A resist pattern was formed at an optimum dose by changing the focal depth from −1.0 μm to +1.0 μm at an interval of 0.1 μm. The focal depth range in which the resist pattern line width is in the range of 216-264 nm was taken as the depth of field (DOF).

Bias of Condensation and Rarefaction

The condensation and rarefaction bias was evaluated by the line width difference between a line-and-space (1L1S) pattern and a line-and-space (1L10S) pattern formed by irradiation of an optimum dose.

The components in Table 5 other than those described above are as follows.

Anthracene Derivative (A)
A1-1: Anthracene-9-carboxylic acid (commercially available product)

Acid Generator (B)
B-4: N-(trifluoromethanesulfonyloxy)bicyclo[2.2.1]hept-5-ene-2,3-dicarboxyimide
B-6: N-[(5-methyl-5-carboxymethylbicyclo[2.2.1]heptan-2-yl)sulfonyloxy] succinimide,
B-7: 2,4,6-Trimethylphenyldiphenylsulfonium 2,4-difluorobenzenesulfonate Acid-Dissociable Group-Containing Resin (C)
C-3: 4-hydroxystyrene/styrene/4-t-butoxystyrene copolymer (Synthesis Example 7)

Additive (Acid Diffusion Controller)
F-2: N-(t-butoxycarbonyl)-2-phenylbenzimidazole Solvent
S-1: ethyl lactate
S-3: propylene glycol monomethyl ether acetate

TABLE 5

|  | Photosensitizer (part by weight) | Acid generator (B) (part by weight) | Acid-dissociable group-containing resin (C) (part by weight) | Additive (part by weight) | Solvent (part by weight) |
| --- | --- | --- | --- | --- | --- |
| Example 12 | A2-1 (7) | B-4 (6) | C-3 (95) | F-2 (0.12) | S-1 (560) |
|  |  | B-6 (6) |  | F-3 (5) | S-3 (240) |
|  |  | B-7 (0.2) |  |  |  |

TABLE 5-continued

| | Photosensitizer (part by weight) | Acid generator (B) (part by weight) | Acid-dissociable group-containing resin (C) (part by weight) | Additive (part by weight) | Solvent (part by weight) |
|---|---|---|---|---|---|
| Example 13 | A2-2 (7) | B-4 (6) B-6 (6) B-7 (0.2) | C-3 (95) | F-2 (0.12) F-3 (5) | S-1 (560) S-3 (240) |
| Example 14 | A1-1 (7) | B-4 (6) B-6 (6) B-7 (0.2) | C-3 (95) | F-2 (0.12) F-3 (5) | S-1 (560) S-3 (240) |

TABLE 6

| | Sensitivity (J/m$^2$) | Film thickness decrease in unexposed areas (Å) | Exposure allowance (%) | DOF (μm) | Bias of condensation and rarefaction (nm) |
|---|---|---|---|---|---|
| Example 12 | 232 | 192 | 26.3 | 0.90 | 41.0 |
| Example 13 | 231 | 192 | 26.5 | 0.90 | 39.0 |
| Example 14 | 232 | 192 | 26.0 | 0.90 | 40.0 |

What is claimed is:

1. A positive tone radiation-sensitive resin composition comprising:
(A) an anthracene derivative of the following formula (1),

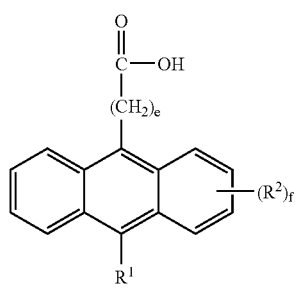

(1)

wherein $R^1$ represents a hydrogen atom or a monovalent organic group having 1-12 carbon atoms, $R^2$ individually represents a monovalent organic group having 1-12 carbon atoms, e indicates an integer of 0-3, and f is an integer of 0-8,
(B) a photoacid generator comprising a sulfonimide compound, and
(C) a resin containing an acid-dissociable group which is insoluble or scarcely soluble in alkali, but becomes soluble in alkali when the acid-dissociable group dissociates.

2. The positive-tone radiation-sensitive resin composition according to claim 1, wherein the metal impurity content in the component (A), in terms of the total ion content, is 5,000 ppb or less.

3. The positive-tone radiation-sensitive resin composition according to claim 2, wherein the content of sodium ion is 500 ppb or less, the content of potassium ion is 50 ppb or less, and the content of iron (III) ion is 500 ppb or less in the component (A).

4. The positive-tone radiation-sensitive resin composition according to claim 1, wherein the component (C) is a resin comprising a recurring unit of the following formula (2) and a recurring unit of the following formula (3) and/or a recurring unit of the following formula (4),

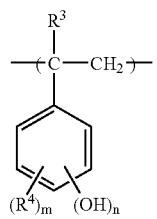

(2)

wherein $R^3$ represents a hydrogen atom or a methyl group, $R^4$ represents a monovalent organic group (excluding the same group as —$OR^7$ in the formula (3)), m is an integer of 0-3, and n is an integer of 1-3, two or more $R^4$ groups which may present being either the same or different,

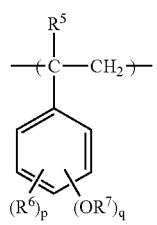

(3)

wherein $R^5$ represents a hydrogen atom or a methyl group, $R^6$ represents a monovalent organic group (excluding the group same as —$OR^7$), $R^7$ represents a monovalent acid-dissociable group, p is an integer of 0-3, and q is an integer of 1-3, two or more $R^6$ groups and two or more $R^7$ groups which may be present being either the same or different, and

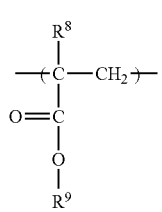

(4)

wherein $R^8$ represents a hydrogen atom or a methyl group and $R^9$ represents a t-butyl group.

5. The positive-tone radiation-sensitive resin composition according to claim 1, further comprising (D) a dye other than the anthracene derivative shown by the formula (1) of claim 1.

6. The positive-tone radiation-sensitive resin composition according to claim 5, wherein the component (D) is selected from the group consisting of anthracene derivatives, carbazole derivatives, and benzophenone derivatives.

7. The positive-tone radiation-sensitive resin composition according to claim 4, further comprising (D) a dye other than the anthracene derivative shown by the formula (1) of claim 1.

8. The positive-tone radiation-sensitive resin composition according to claim 7, wherein the component (D) is selected from the group consisting of anthracene derivatives, carbazole derivatives, and benzophenone derivatives.

9. The positive-tone radiation-sensitive resin composition according to claim 1, further comprising (E) a compound shown by the following formula (5),

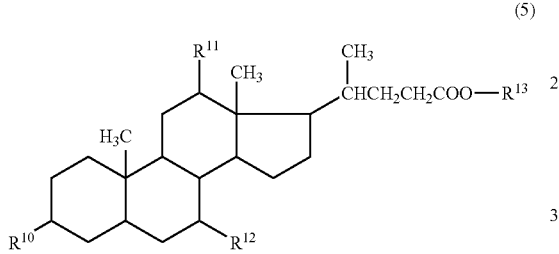

(5)

wherein $R^{10}$, $R^{11}$, and $R^{12}$ individually represent a hydrogen atom, a hydroxyl group, or a monovalent organic group, provided that at least one of the groups $R^{10}$, $R^{11}$, and $R^{12}$ is a hydroxyl group, and $R^{13}$ represents a monovalent acid-dissociable group or a monovalent organic group containing an acid-dissociable moiety in the structure.

10. The positive-tone radiation-sensitive resin composition according to claim 9, wherein $R^{13}$ in the formula (5) representing a compound of the component (E) is a group of the following formula (6),

—CH$_2$COO—R$^{14}$ (6)

wherein $R^{14}$ represents a monovalent acid-dissociable group.

11. The positive-tone radiation-sensitive resin composition according to claim 4, further comprising (E) a compound shown by the following formula (5),

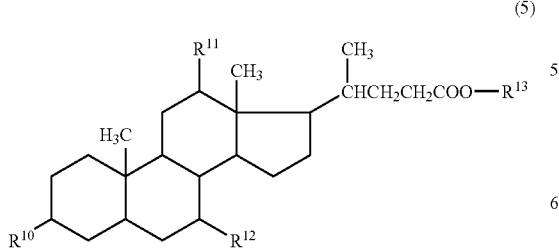

(5)

wherein $R^{10}$, $R^{11}$, and $R^{12}$ individually represent a hydrogen atom, a hydroxyl group, or a monovalent organic group, provided that at least one of the groups $R^{10}$, $R^{11}$, and $R^{12}$ is a hydroxyl group, and $R^{13}$ represents a monovalent acid-dissociable group or a monovalent organic group containing an acid-dissociable moiety in the structure.

12. The positive-tone radiation-sensitive resin composition according to claim 11, wherein $R^{13}$ in the formula (5) representing a compound of the component (E) is a group of the following formula (6),

—CH$_2$COO—R$^{14}$ (6)

wherein $R^{14}$ represents a monovalent acid-dissociable group.

13. The positive-tone radiation-sensitive resin composition according to claim 5, further comprising (E) a compound shown by the following formula (5),

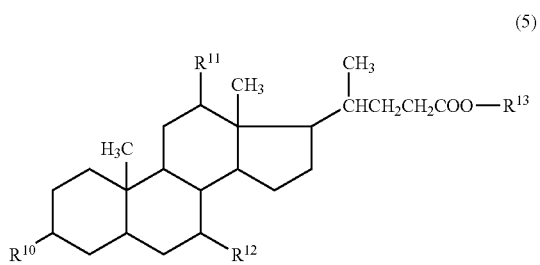

(5)

wherein $R^{10}$, $R^{11}$, and $R^{12}$ individually represent a hydrogen atom, a hydroxyl group, or a monovalent organic group, provided that at least one of the groups $R^{10}$, $R^{11}$, and $R^{12}$ is a hydroxyl group, and $R^{13}$ represents a monovalent acid-dissociable group or a monovalent organic group containing an acid-dissociable moiety in the structure.

14. The positive-tone radiation-sensitive resin composition according to claim 13, wherein $R^{13}$ in the formula (5) representing a compound of the component (E) is a group of the following formula (6),

—CH$_2$COO—R$^{14}$ (6)

wherein $R^{14}$ represents a monovalent acid-dissociable group.

15. The positive-tone radiation-sensitive resin composition according to claim 6, further comprising (E) a compound shown by the following formula (5),

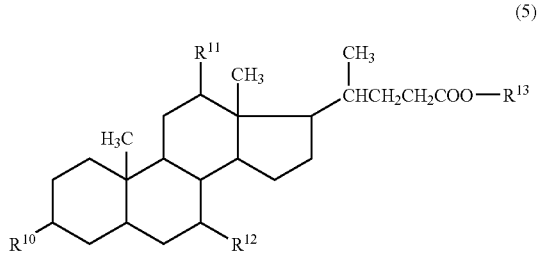

(5)

wherein $R^{10}$, $R^{11}$, and $R^{12}$ individually represent a hydrogen atom, a hydroxyl group, or a monovalent organic group, provided that at least one of the groups $R^{10}$, $R^{11}$, and $R^{12}$ is a hydroxyl group, and $R^{13}$ represents a monovalent acid-dissociable group or a monovalent organic group containing an acid-dissociable moiety in the structure.

16. The positive-tone radiation-sensitive resin composition according to claim 15, wherein $R^{13}$ in the formula (5) representing a compound of the component (E) is a group of the following formula (6),

  (6)

wherein $R^{14}$ represents a monovalent acid-dissociable group.

17. The positive-tone radiation-sensitive resin composition according to claim 7, further comprising (E) a compound shown by the following formula (5),

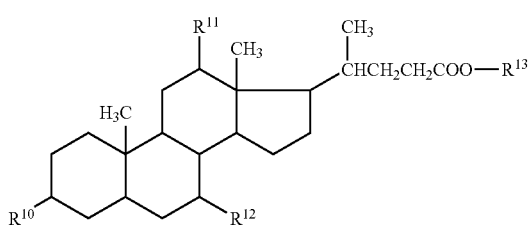  (5)

wherein $R^{10}$, $R^{11}$, and $R^{12}$ individually represent a hydrogen atom, a hydroxyl group, or a monovalent organic group, provided that at least one of the groups $R^{10}$, $R^{11}$, and $R^{12}$ is a hydroxyl group, and $R^{13}$ represents a monovalent acid-dissociable group or a monovalent organic group containing an acid-dissociable moiety in the structure.

18. The positive-tone radiation-sensitive resin composition according to claim 17, wherein $R^{13}$ in the formula (5) representing a compound of the component (E) is a group of the following formula (6),

  (6)

wherein $R^{14}$ represents a monovalent acid-dissociable group.

19. The positive-tone radiation-sensitive resin composition according to claim 8, further comprising (E) a compound shown by the following formula (5),

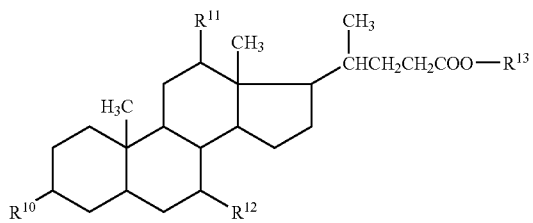  (5)

wherein $R^{10}$, $R^{11}$, and $R^{12}$ individually represent a hydrogen atom, a hydroxyl group, or a monovalent organic group, provided that at least one of the groups $R^{10}$, $R^{11}$, and $R^{12}$ is a hydroxyl group, and $R^{13}$ represents a monovalent acid-dissociable group or a monovalent organic group containing an acid-dissociable moiety in the structure.

20. The positive-tone radiation-sensitive resin composition according to claim 19, wherein $R^{13}$ in the formula (5) representing a compound of the component (E) is a group of the following formula (6),

  (6)

wherein $R^{14}$ represents a monovalent acid-dissociable group.

21. The positive-tone radiation-sensitive resin composition according to claim 1, wherein $R^1$ represents a monovalent organic group having 1-12 carbon atoms.

22. The positive-tone radiation-sensitive resin composition according to claim 21, wherein $R^1$ is selected from the group consisting of a methyl group, an ethyl group, a methoxymethyl group, a carboxyl group, a methoxycarbonyl group, a t-butoxycarbonyl group, a carboxymethyl group, a methoxycarbonylmethyl group, and a t-butoxycarbonylmethyl group.

23. The positive-tone radiation-sensitive resin composition according to claim 21, wherein the anthracene derivative (A) is anthracene-9, 10-dicarboxylic acid.

* * * * *

UNITED STATES PATENT AND TRADEMARK OFFICE
CERTIFICATE OF CORRECTION

| | |
|---|---|
| PATENT NO. | : 7,335,457 B2 |
| APPLICATION NO. | : 11/235101 |
| DATED | : February 26, 2008 |
| INVENTOR(S) | : Daisuke Shimizu et al. |

It is certified that error appears in the above-identified patent and that said Letters Patent is hereby corrected as shown below:

Title Page; item (30);
The filing date of the JP 2005-218054 priority document appearing on the face of the patent should read Jul. 27, 2005 instead of Jul. 24, 2005.

Signed and Sealed this

Twenty-sixth Day of August, 2008

JON W. DUDAS
*Director of the United States Patent and Trademark Office*